United States Patent [19]

Asano et al.

[11] Patent Number: 5,067,111

[45] Date of Patent: Nov. 19, 1991

[54] SEMICONDUCTOR MEMORY DEVICE HAVING A MAJORITY LOGIC FOR DETERMINING DATA TO BE READ OUT

[75] Inventors: Masamichi Asano, Tokyo; Hiroshi Iwahashi, Yokohama; Sadayuki Yokoyama, Kawasaki, all of Japan

[73] Assignee: Kabushiki Kaisha Toshiba, Kawasaki, Japan

[21] Appl. No.: 426,803

[22] Filed: Oct. 26, 1989

[30] Foreign Application Priority Data

Oct. 28, 1988 [JP] Japan .............................. 63-272046

[51] Int. Cl.[5] .......................... G11C 7/00; G06F 11/08
[52] U.S. Cl. .......................... 365/189.08; 365/189.07; 365/201; 371/36
[58] Field of Search .............. 365/185, 189.07, 189.08, 365/200, 201, 230.03; 371/10.1, 10.2, 10.3, 36; 307/464

[56] References Cited

U.S. PATENT DOCUMENTS

| | | | |
|---|---|---|---|
| 3,681,578 | 8/1972 | Stevens ................................. | 371/36 |
| 3,863,215 | 1/1975 | McGrogan, Jr. ....................... | 371/36 |
| 4,282,446 | 8/1981 | McElroy .............................. | 365/185 |
| 4,375,683 | 3/1983 | Wensley ................................ | 371/36 |
| 4,376,947 | 2/1983 | Chio et al. ............................. | 365/185 |
| 4,450,538 | 5/1984 | Shirasaka ......................... | 365/230.03 |
| 3,748,594 | 5/1988 | Iida ...................................... | 365/200 |

OTHER PUBLICATIONS

Cioaca et al., "A Million-Cycle CMOS 256K EEPROM," IEEE Journal of Solid-State Circuits, vol. SC-22, No. 5, pp. 684–692, Oct. 1987.

Primary Examiner—Stuart N. Hecker
Assistant Examiner—Jack A. Lane
Attorney, Agent, or Firm—Finnegan, Henderson, Farabow, Garrett and Dunner

[57] ABSTRACT

A semiconductor memory device comprising a first Electrically Erasable Programmable Read Only Memory (EEPROM) cell array, a first row decoder, a first column decoder, two second EEPROM arrays each having a storage area equal in capacity to the specified storage area defined in the first EEPROM array, a second row decoder, a second column decoder, and a majority logic circuit. The first row decoder and the first column decoder access one of the memory cells of the first EEPROM array. The second row decoder and the second column decoder access one of the memory cells of either the second EEPROM array when one of the memory cells of first EEPROM array is accessed. The majority logic circuit carries out a majority logic operation on the data items read from the accessed memory cell of the first EEPROM array and the data items read from the accessed memory cells of the second EEPROM arrays, thereby to determine which data item is to be read out to an external device.

18 Claims, 15 Drawing Sheets

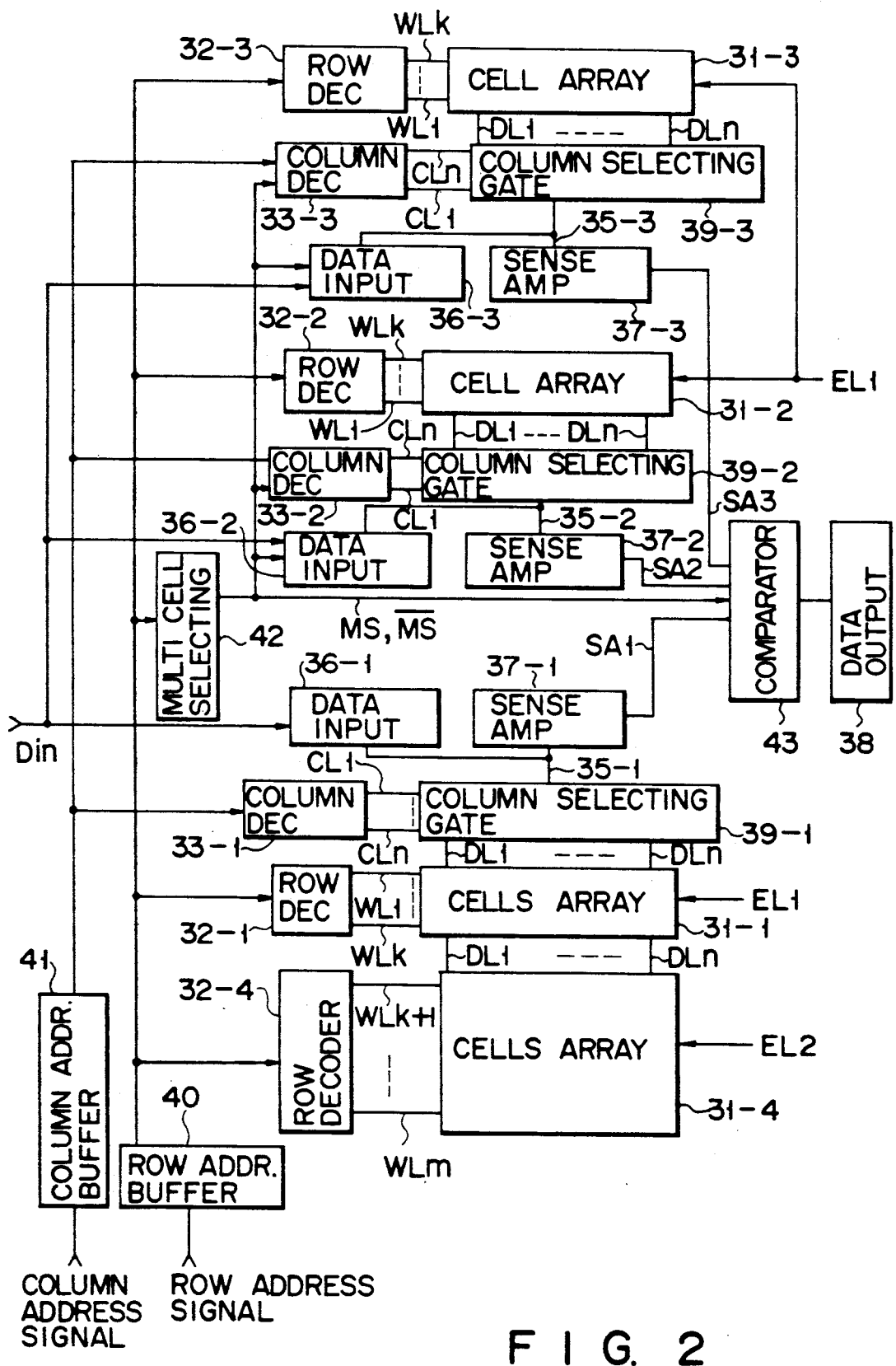
F I G. 2

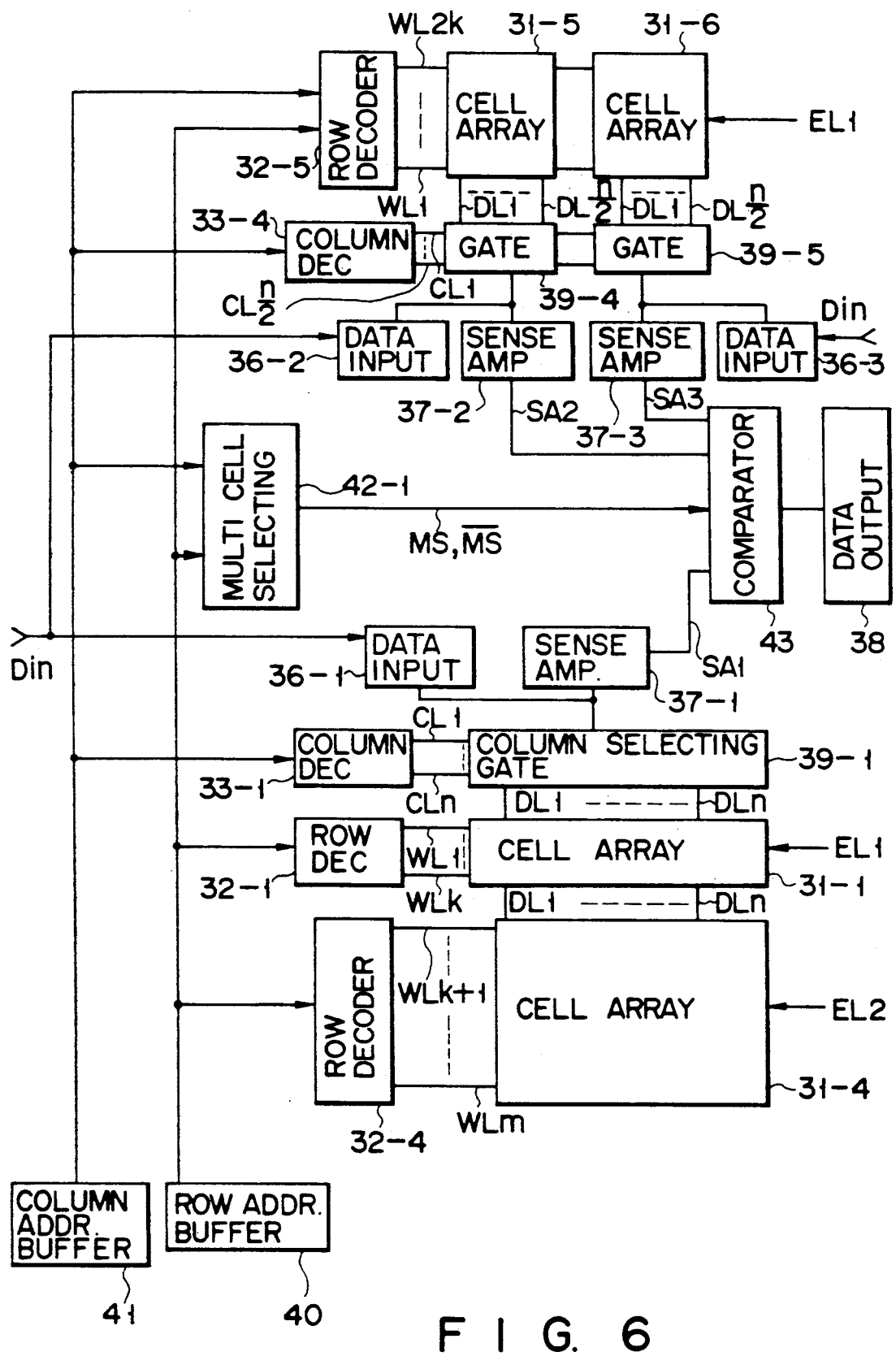
F I G. 6

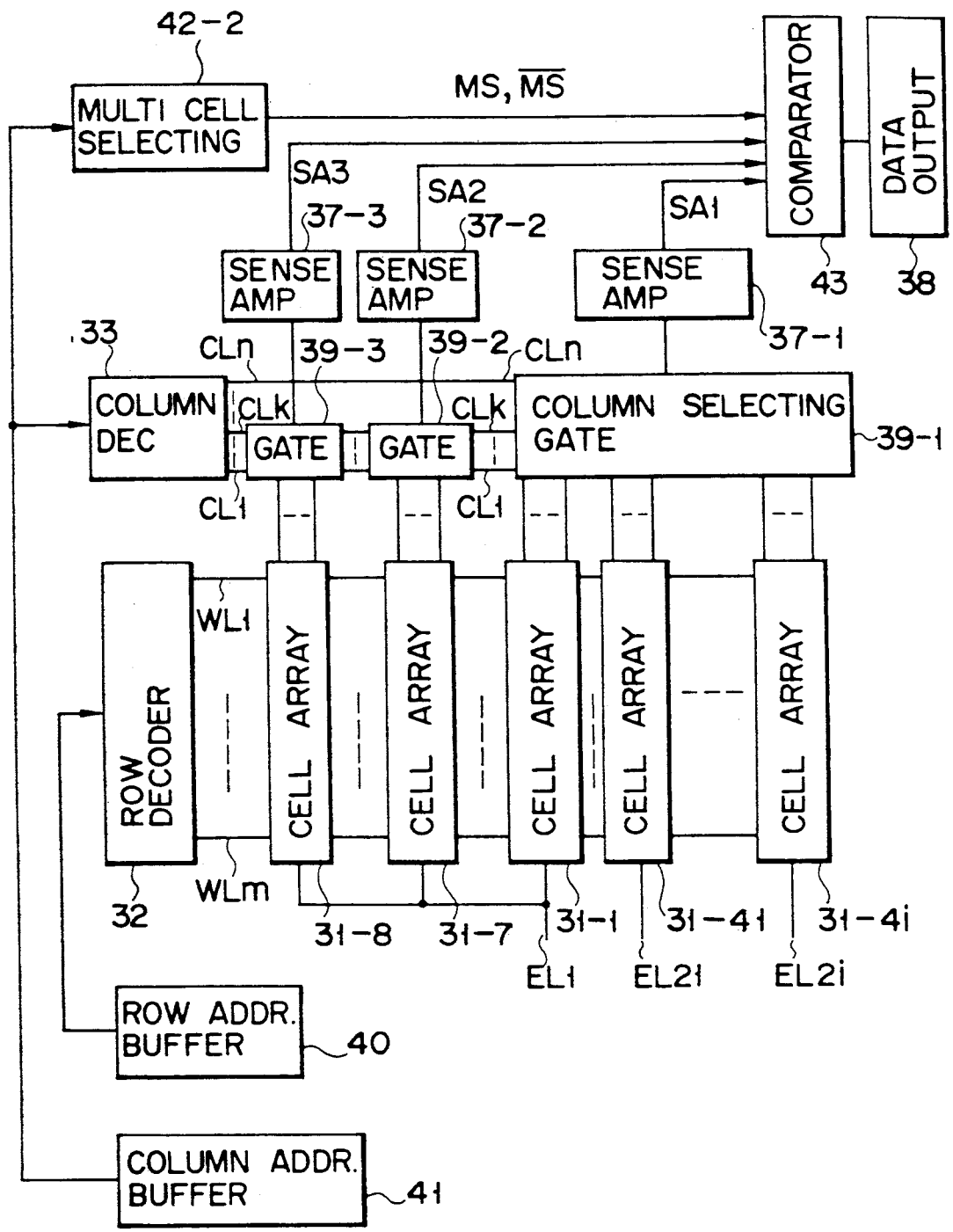
F I G. 8

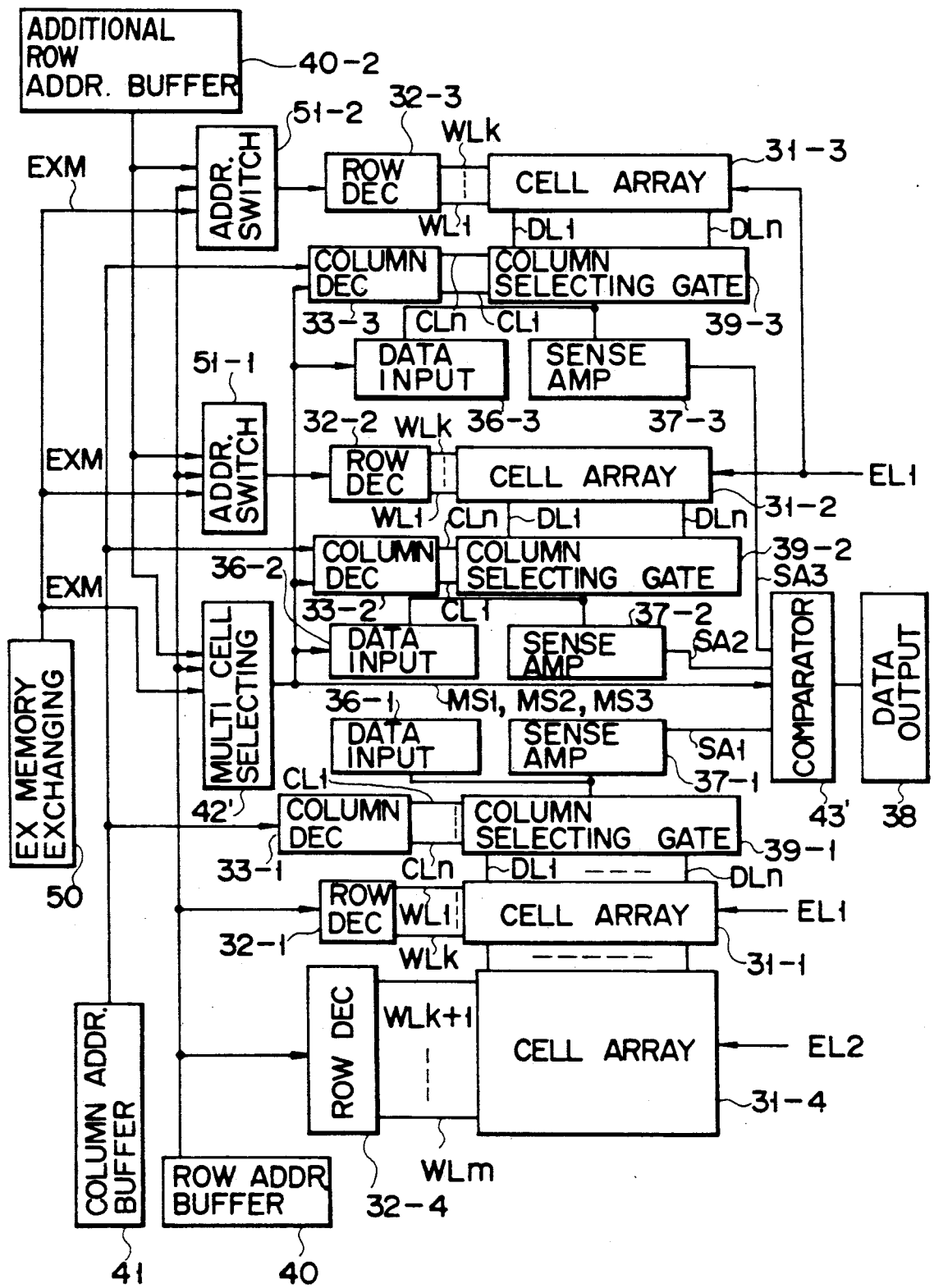
F I G. 9

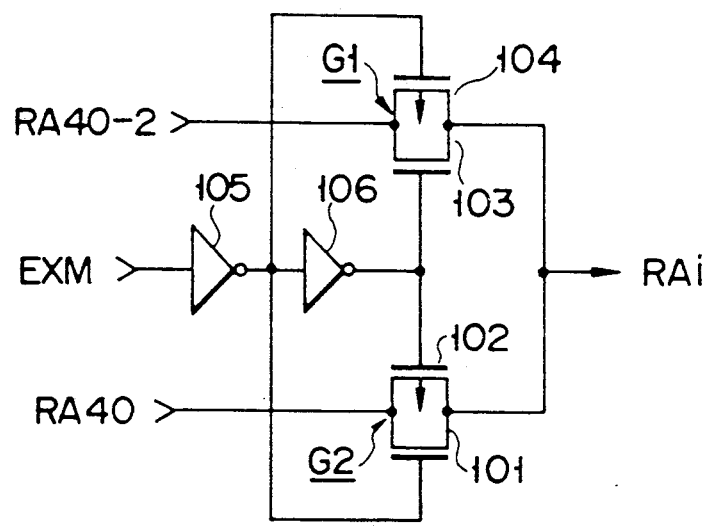
F I G. 10
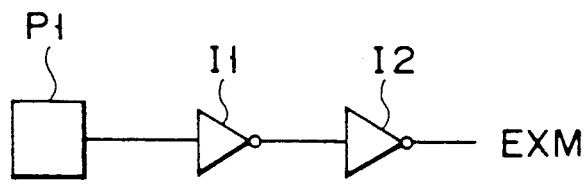
F I G. 11A
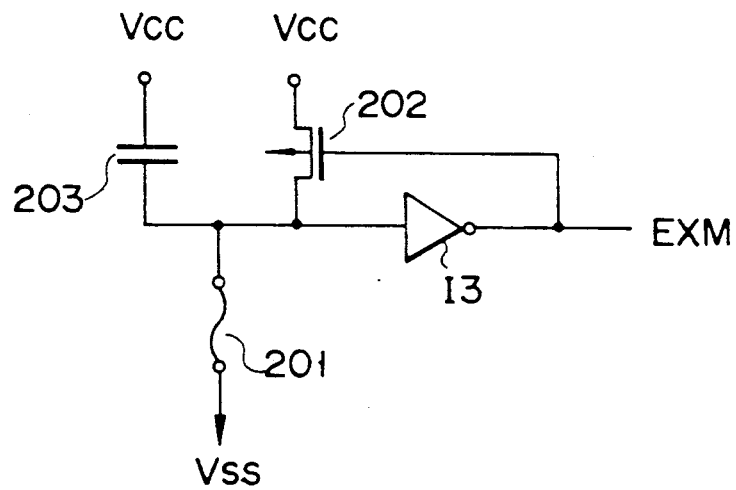
F I G. 11B

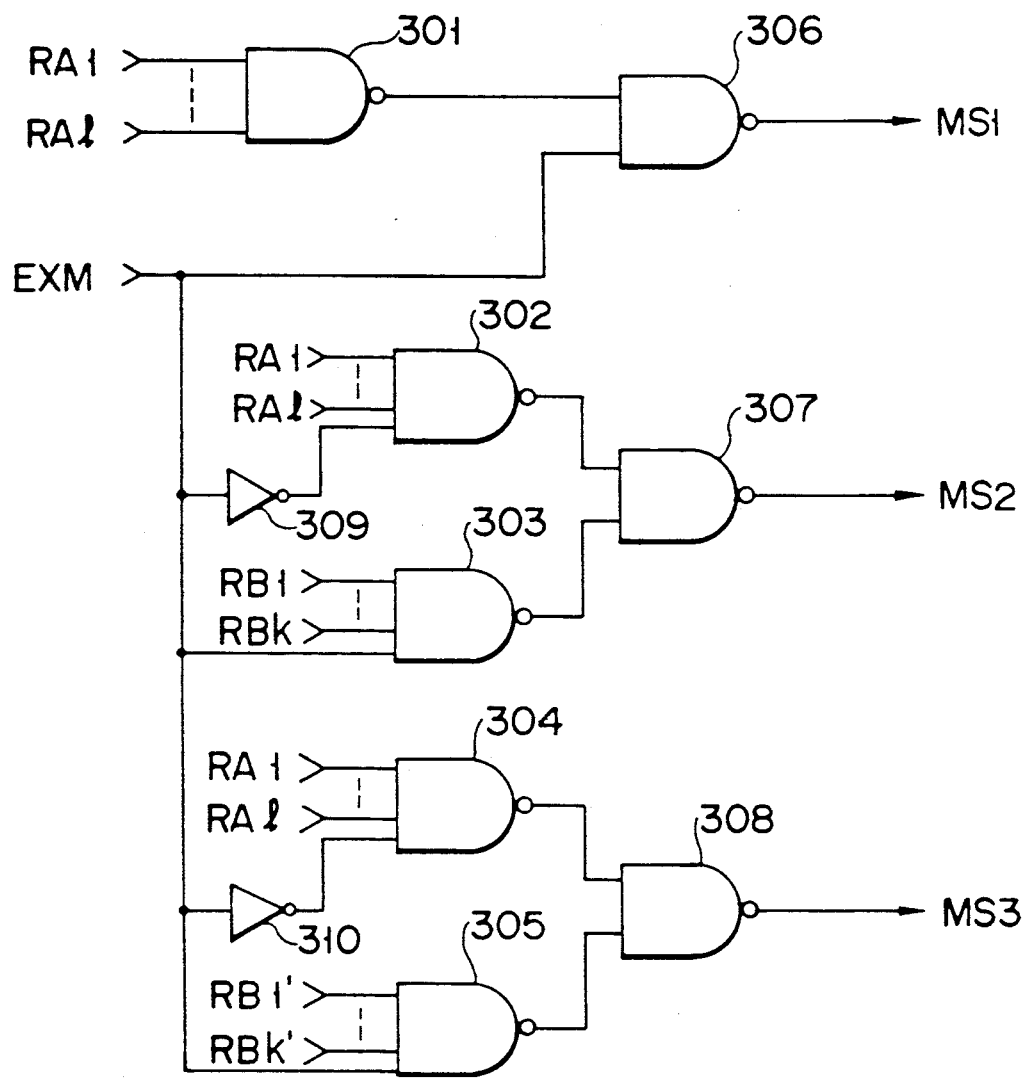
F I G. 12

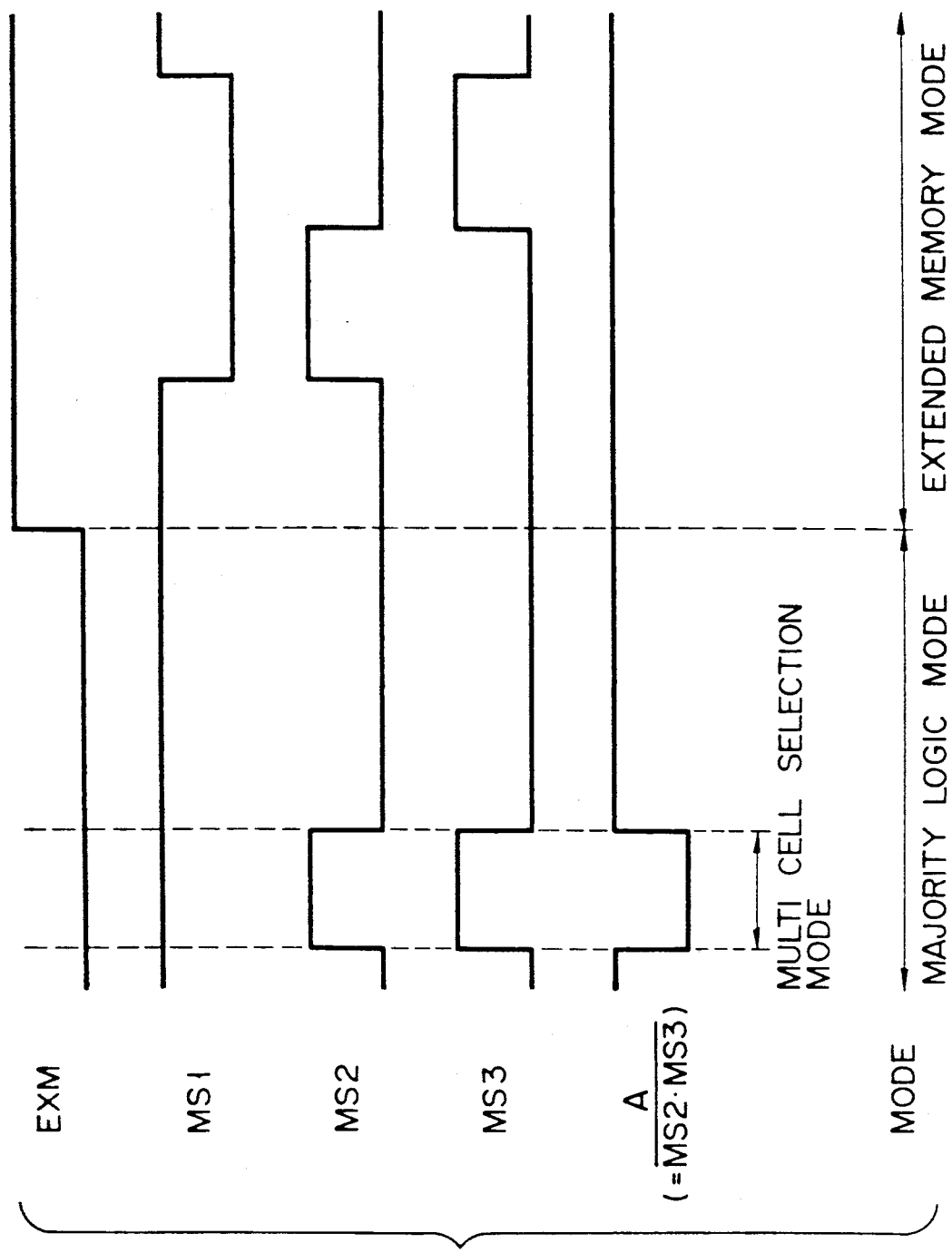
F I G. 14

| OPERATION MODE | $V_{CG}$ | $V_D$ | $V_S$ | $V_{EG}$ | $V_{FG}$ | CONDITION OF FLOATING GATE |
|---|---|---|---|---|---|---|
| ERASE ("1") | 0$^V$ | 0$^V$ | 0$^V$ | 27$^V$ | H | MOVEMENT OF ELECTRONS FROM FLOATING GATE TO ERASE GATE |
| WRITE ("0") | 21$^V$ | 10$^V$ | 0$^V$ | 5$^V$ | L | INJECTION OF ELECTRONS FROM DRAIN TO FLOATING GATE |
| WRITE ("1") | 21$^V$ | 0$^V$ | 0$^V$ | 5$^V$ | H | NO MOBILE ELECTRON |

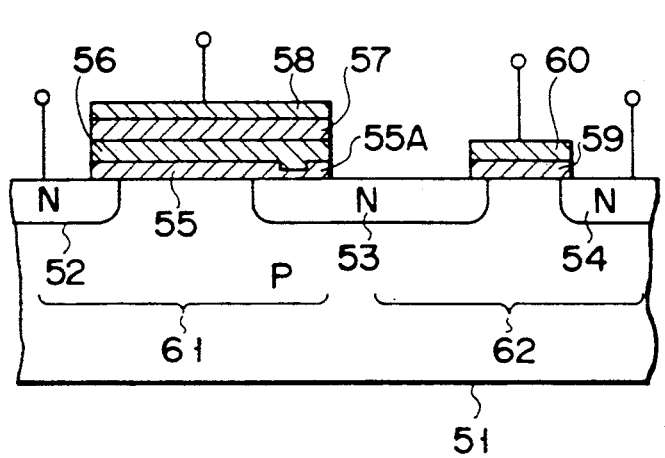
FIG. 18
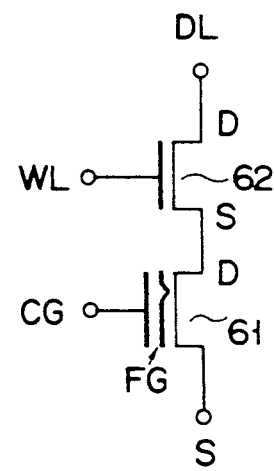
FIG. 19
| OPERATION MODE | $V_{WL}$ | $V_{CG}$ | $V_S$ | $V_{DL}$ | $V_{FG}$ | CONDITION OF FLOATING GATE |
|---|---|---|---|---|---|---|
| ERASE ("1") | H | H | 0V | 0V | H | INJECTION OF ELECTRONS FROM DRAIN TO FLOATING GATE |
| WRITE ("0") | H | 0V | H | H | L | MOVEMENT OF ELECTRONS FROM FLOATING GATE TO DRAIN |
| WRITE ("1") | H | 0V | H | 0V | L | NO MOBILE ELECTRON |
| READ | 5V | 0V | 0V | 1V | — | — |
FIG. 20

SEMICONDUCTOR MEMORY DEVICE HAVING A MAJORITY LOGIC FOR DETERMINING DATA TO BE READ OUT

BACKGROUND OF THE INVENTION

1. Field of the Invention

The present invention relates to a semiconductor memory device, and more particularly, to a semiconductor memory device which has a majority logic for determining data to be read out to an external device.

2. Description of the Related Art

Electrically erasable programmable read-only memories (EEPROMs) are known, the contents of which can be erased electrically, and into which new contents can be written. EEPROMs are used, for example, in memory cards, in greater number than ultraviolet-erasable programmable read-only memories (UVPROMs) whose contents can be erased by ultraviolet light. This is because data can be erased from an EEPROM by means of electrical signals even after the EEPROM has been mounted on a circuit board. The memory cells of a typical EEPROM each consist of one nonvolatile transistor which has a control gate, a floating gate, and an erasing gate. These memory cells can, therefore, be relatively small. When an EEPROM is manufactured in compliance with, for example, the 2 μm-design rule, each of its memory cells occupies an area of approximately 64 $\mu m^2$.

The basic operation of an EEPROM memory cell will be explained. At first, it will be described how to erase the data stored in the EEPROM memory cell. First, the source potential, drain potential and control-gate potential of the cell transistor are set at 0 V, and the erasing-gate potential at, for example, +27 V. Then, electrons are emitted from the floating gate to the erasing gate, by virtue of the Fowler-Nordheim tunnel effect. Hence, the floating gate is positively charged, lowering the threshold voltage of the cell transistor. As a result, a data "1" is stored into the EEPROM memory cell.

In order to write a data "0" into the EEPROM memory cell storing the data "1", the control-gate potential, drain potential, source potential and erasing-gate potential of the cell transistor are set at +21 V, 10 V, 0 V and +5 V, respectively. As a result of this, hot-electron effect occurs near the drain of the cell transistor, whereby the electrons generated due to impact ionization are injected into the floating gate of the cell transistor. The floating gate of the cell transistor is thereby charged negatively, increasing the threshold voltage of the cell transistor. The cell therefore stores a data "0". On the other hand, when the drain potential is set at 0 V, not +10 V, no hot-electron effect occurs, and no electrons are injected into the floating gate, whereby the data "1" remains in the memory cell. Thus, a data "0" is written into the memory cell when the drain of the cell transistor is set at a high potential, and a data "1" remains in the memory cell when the drain of the cell transistor is set at a low potential.

As has been pointed out, the memory cells of an EEPROM occupy but a relatively small area. An EEPROM is therefore suitable for a large-capacity memory, and can be used as an internal memory of a computer system, in place of an external memory such as a floppy disk.

FIG. 1 is a schematic representation of the storage area of a floppy disk of the type commonly used in general-purpose computers. Most double-side, double-density floppy disks have 1280 sectors to store 640 KB (Kilo-bytes) of data. As is shown in FIG. 1, the storage area of the floppy disk consists of four sub-areas—a boot-load program area B (1 sector), a fail-allocation table area FAT (2 sectors), a directory-entry area DE (4 sectors), and a data storage area DATA (1273 sectors). The data stored in the area B is a program for controlling the computer system, such as a boot-load program for starting the computer system. What is stored in the area FAT is the data dividing the data stored in area DATA into a plurality of regions. The directory-entry area DE is used to store file information such as the names of files, the sizes of files, and the like. The area DATA is provided for storing general data. The data stored in the boot-load program area B is seldom erased. In other words, a write/erase (W/E) operations is rarely carried out on the boot-load program area B. By contrast, the W/E operation is frequently performed on the fail-allocation table area FAT, since the data stored in this area FAT represents the condition in which the area DATA is used. The data stored in the area FAT includes data pieces representing defective ones of the sectors constituting the data storage area DATA. If these data pieces are unreliable, the floppy disk can no longer be used. Hence, it is required that data be stored more reliably than the areas B, DE, and DATA.

Most EEPROMs can be correctly subjected to the W/E operation, about $10^3$ to $10^4$ times. When an EEPROM has been accessed more times, the gate-insulating film of each cell transistor is likely to be broken when data is erased from the cell transistor, or the gate-insulating film of the cell transistor is likely to trap electrons from the vicinity of the drain when data is written into the cell transistor. Nonetheless, it is quite rare that two or more cell transistors simultaneously encounter such an adverse phenomenon; the probability for said phenomenon to occur in one cell transistor is 100 to 1000 parts per million.

Let us assume that an EEPROM is used in a general-purpose computer, in place of a floppy disk. If any of the cell transistors constituting a data storage area DATA undergoes defects, then data identifying the defective cell transistor is stored in the fail-allocation table area FAT in order to avoid use of the defective cell transistor. In this case, therefore, no problems arise. However, a problem does arise if one of the cell transistors constituting the area FAT undergoes said undesirable phenomenon. If this is the case, the EEPROM can no longer be used in a computer system. In view of this fact, it is impractical to use the conventional EEPROMs in computers, in place of floppy disks which have a fail-allocation table area FAT whose contents must not be destroyed or a altered.

SUMMARY OF THE INVENTION

The object of the present invention is to provide a semiconductor memory device with a specific storage area of which remains reliable even if a bit error occurs in this storage area at a probability less than a predetermined value.

According to this invention, there is provided a semiconductor memory device comprising: a first array of memory cells in which data is able to be rewritten electrically; first memory-accessing means for accessing any one of the memory cells of the first array; at least two second arrays of memory cells, each second array consisting of substantially the same number of memory cells as the specified ones of the memory cells of the first array, in which data is able to be rewritten electrically; second memory-accessing means for accessing any one of the memory cells of each second array which corresponds to the memory cell of the specified memory cells of the first array accessed by the first memory-accessing means; and majority logic means for performing a majority logic operation on a first data read from any one of the specified memory cells of the first array which have been accessed by the first memory-accessing means and each of second data read from those memory cells of the second arrays accessed by the second memory-accessing means, thereby to determine data which is to be read out to an external device.

The data read from the specified memory cells of the first array is not directly read out from this semiconductor memory device to an external device. Rather, what is read to the external device is the data which has been determined by means of majority logic operation carried out on the data read from the specified memory cells of the first memory-cell array and also the data read from the second memory-cell arrays. Generally, the probability is very low that any specified memory cell of the first array and any memory cell of either second array are defective at the same time. Hence, any data supplied from this memory device to the external device is correct even if the specified memory cells of the first array include a defective memory cell. The semiconductor memory device according to the present invention is greatly reliable.

BRIEF DESCRIPTION OF THE DRAWINGS

FIG. 2 is a block diagram illustrating an EEPROM which is a first embodiment of the present invention;

FIG. 6 is a block diagram illustrating an EEPROM which is a second embodiment of the invention;

FIG. 8 is a block diagram representing an EEPROM which is a fourth embodiment of the present invention;

FIG. 9 is a block diagram showing an EEPROM which is a fifth embodiment of the invention;

FIG. 10 is a circuit diagram illustrating the address switching circuit incorporated in the EEPROM shown in FIG. 9;

FIG. 11A is a diagram showing the extension memory exchanging circuit used in the EEPROM shown in FIG. 9;

FIG. 11B illustrates an extension memory exchanging circuit which can be used in place of the circuit shown in FIG. 11A;

FIG. 12 is a diagram showing the multi-cell selecting circuit used in the EEPROM shown in FIG. 9;

FIG. 14 is a timing chart explaining the operation of the EEPROM shown in FIG. 5;

FIG. 18 is a cross-sectional view of another type of a memory cell which can be used in great number in any EEPROM according to the present invention;

FIG. 19 is an equivalent circuit diagram of the memory cell shown in FIG. 18; and FIG. 20 is a table explaining the operation of the memory cell illustrated in FIG. 18.

DETAILED DESCRIPTION OF THE PREFERRED EMBODIMENTS

Figure 1:
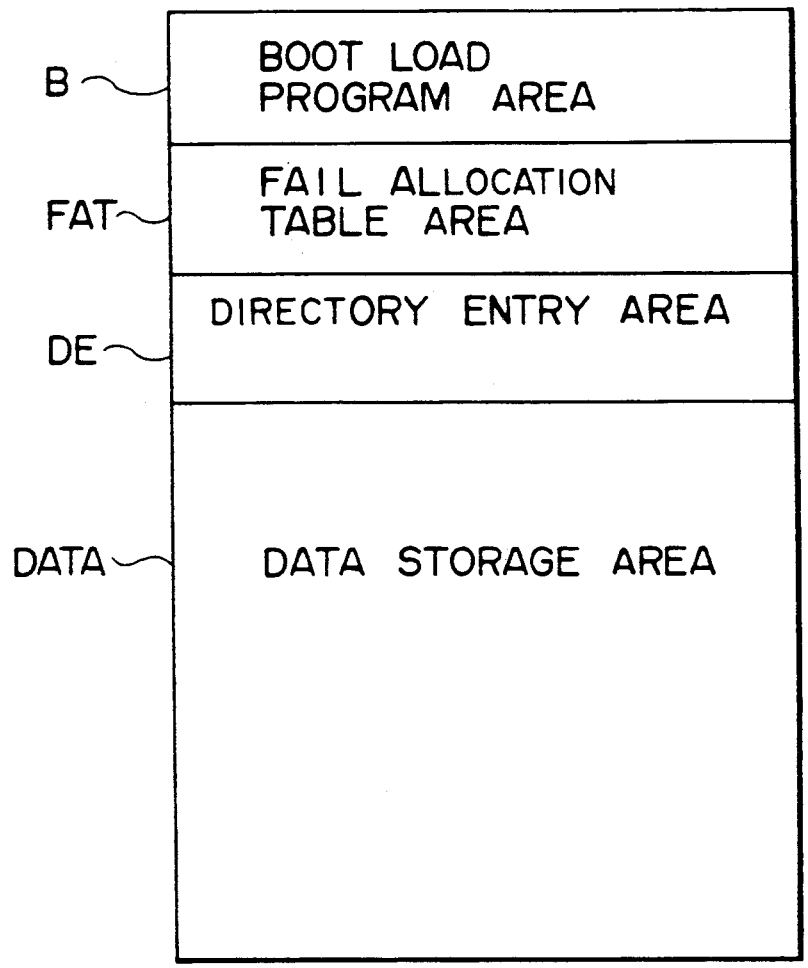
FIG. 1 is a diagram schematically representing the storage area of a floppy disk used as an external memory for a computer system.

An EEPROM, which is the first embodiment of the present invention will now be described with reference to FIG. 2. This EEPROM is designed to write and read data, bit by bit. As is shown in FIG. 2, the EEPROM has m (row)×n (column) cell array, which consists of a k (row)×n (column) cell-array block 31-1 and a m×k (row)×n (column) cell-array block 31-4. The cell-array block 31-1 and the cell-array block 31-4 have a number of nonvolatile transistors each. Each of these nonvolatile transistors functions as memory cells, and comprises a floating gate, a control gate, and erasing gate.

Different address spaces are allotted to the cell-array blocks 31-1 and 31-4. The cell transistors of the cell-array block 31-1 are arranged at the intersections of word lines WL1 to WLk and bit lines DL1 to DLn. The control gate of each cell transistor of the block 31-1 is connected to the corresponding word line, and the drain thereof is connected to the corresponding bit line. An erase-gate control signal EL1 is supplied to the erasing gates of the cell transistors of the block 31-1. The cell transistors of the cell-array block 31-4 are arranged at the intersections of word lines WLk+1 to WLm and bit lines DL1 to DLn. The control gate of each cell transistor of the block 31-4 is connected to the corresponding word line, and the drain thereof is connected to the corresponding bit line. An erase-gate control signal EL2 is supplied to the erasing gates of the cell transistors of the block 31-4.

As is illustrated in FIG. 2, the EEPROM further comprises four row decoders 32-1, 32-2, 32-3 and 32-4, three column decoders 33-1, 33-2, and 33-3, three data lines 35-1, 35-2, and 35-3, two data-input circuit 36-1 and 36-2, three sense amplifiers 37-1, 37-2, and 37-3, a data-output circuit 38, three column-selecting gates 39-1, 39-2, and 39-3, a row address buffer 40, column address buffer 41, a multi-cell selecting circuit 42, and a comparator 43.

The row decoder 32-1 decodes the first address signal supplied from an external device through the row address buffer 40, selects one of the word lines WL1 to WLk in accordance with the first row address signal thus decoded, and energizes the word line thus selected. The row decoder 32-4 decodes the second row address signal supplied from the external device through the row address buffer 40, selects one of the word lines WLk+1 to WLm in accordance with the second row address signal thus decoded, and energized the word line thus selected.

The cell transistors of the cell-array block 31-1, which are connected to the selected and energized one of the word lines WL1 to WLk, can store data on the corresponding bit lines DL1 to DLn or apply read data to these bit lines. Similarly, the cell transistors of the cell-array block 31-4, which are connected to the selected and energized one of the word lines WLk+1 to WLm, can store data on the corresponding bit lines DL1 to DLn or apply read data to these bit lines.

The column decoder 33-1 is associated with the cell-array blocks 31-1 and 31-4. It decodes the column address signal supplied from an external device through the column address buffer 41, selects one of the column-selecting lines CL1 to CLn in accordance with the column address signal thus decoded, and energizes the column-selecting line thus selected. The column-selecting gate 39-1 selects one of the bit lines DL1 to DLn in accordance with the column-selecting line energized by means of the column decoder 33-1.

The data-input circuit 36-1 and the sense amplifier 37-1 are connected to the data line 35-1. The data-input circuit 36-1 receives input data Din from an external device and sets the potential of the data line 35-1 at the value equivalent to the input data Din, i.e., either a "0" or a "1". The sense amplifier 37-1 detects the data read from any memory cell of the cell-array block 31-1 or 31-4, and determines whether or not this data is a "0" or a "1".

As is shown in FIG. 2, the EEPROM further comprises two cell-array blocks 31-2 and 31-3, to which the same address space is allotted as to the cell-array block 31-1. These blocks 31-2 and 31-3 are of the k (row)×n (column) configuration, like the cell-array block 31-1. Therefore, they have the same storage capacity as the cell-array block 31-1. Like the cell-array blocks 31-1 and 31-4, the cell-array blocks 31-2 and 31-3 have a number of nonvolatile transistors each. Each of these nonvolatile transistors functions as memory cells, and comprises a floating gate, a control gate, and erasing gate. An erasing-gate signal EL1 is supplied to the erasing gates of the memory cells of the cell-array blocks 31-2 and 31-3.

Associated with these cell-array blocks 31-2 and 31-3 are: row decoders 32-2 and 32-3, the column decoders 33-2 and 33-3, the sense amplifiers 37-2 and 37-3, and column selecting gates 39-2 and 39-3.

The row decoders 32-2 and 32-3 function in the same way as the row decoder 32-1. More specifically, the decoders 32-2 and 32-3 decode the first row-address signal supplied from the external device through the row address buffer 40, select one of the word lines in accordance with the first row-address signal thus decoded, and energizes the word line thus selected.

The first row-address signal is any one of the row-address signals supplied from the external device to the row address buffer 40 whose more significant l bits are all "1", and the second row-address signal is any one of the row-address signals supplied from the external device to the row address buffer 40 whose more significant l bits include at least one "0" bit. This means that row addresses whose more significant l bits are all "1" are allocated commonly to the cell-array blocks 31-1, 31-2, and 31-3, whereas all other row addresses are allocated to the cell-array block 31-4.

The column decoders 33-2 and 33-3 function just in the same way as the column decoder 33-1. In other words, each of these column decoder 33-2, 33-3 decodes a column address signal supplied from the external device through the column address buffer 41, selects one of the column-selecting lines in accordance with the column-address signal thus decoded, and energizes the column-selecting line thus selected. The data-input circuits 36-2 and 36-3 operates in the same way as the data-input circuit 36-1; they set the potentials of the data lines 35-2 and 35-3 at the values which are equivalent to the data Din supplied to them from the external device. The sense amplifier 37-2 determines whether the data read from any selected memory cell of the cell-array block 31-2 to the data line 35-2 is a "0" or a "1". Likewise, the sense amplifier 37-3 determines whether the data read from any selected memory cell of the cell-array block 31-3 to the data line 35-3 is a "0" or a "1".

As has been described, the same address space is allocated to the cell-array blocks 31-1, 31-2, and 31-3. Thus, when any memory cell of the block 31-1 is selected, the corresponding memory cells of the blocks 31-2 and 31-3 are also selected. Hence, the same data is written into the corresponding memory cells of the blocks 31-1, 31-2, and 31-3 when the EEPROM is set in the write mode, and the same data is read from the corresponding memory cells of the blocks 31-1, 31-2, and 31-3 when the EEPROM is set in the read mode. When the EEPROM is set in the read mode, the sense amplifiers 37-1, 37-2, and 37-3 output data items SA1, SA2, and SA3 at the same time. These data items are supplied to the comparator 43.

The comparator 43 is set in multi-cell selection mode or non-multi-cell selection mode in accordance with the output signal of the multi-cell selecting circuit 42. When it is set in the multi-cell selection mode, it performs majority logic operation on the data items SA1, SA2, and SA3. To be more precise, the comparator 43 compares these data items to determine the correct data, such that the best two of the three data items are taken to be correct. That is, a data "1" is determined as being a correct data if two or all of the three data items are "1", and a data "0" is determined as being a correct data if two or all of the three data items are "0". When the comparator 43 is set in the non-multicell selection mode, it does not perform the majority logic operation, and outputs the data items SA1. The data output by the comparator 43 is supplied via the data-output circuit 38 to an external device.

The multi-cell selecting circuit 42 sets multi-cell selecting signals MS and $\overline{MS}$ at "1" and "0" levels, respectively, upon receipt of the first row-address signal from the row address buffer 40, thereby activating the column decoders 32-2 and 32-3 and the data-input circuits 36-2 and 36-3 and setting the comparator 43 into the multi-cell selection mode. As a result, the memory cells of the cell-array blocks 31-1, 31-2, and 31-3 are selected. In other words, multi-cell selection is achieved. On the other hand, when the second-row address signal selects any memory cell of the cell-array block 31-4, the multi-cell selecting circuit 42 sets multi-cell selecting signals MS and $\overline{MS}$ at "0" and "1" levels, respectively, thereby disabling the column decoders 32-2 and 32-3 and the data-input circuits 36-2 and 36-3 and setting the comparator 43 into the non-multi-cell selection mode. Therefore, neither the cell-array block 31-2 nor the cell-array block 31-3 is selected, whereby non-multi-cell selection is performed.

The cell-array block 31-1, whose memory cells are selected by the row and column addresses decoded by the row decoder 32-1 and the column decoder 33-1, respectively, is used as a storage area which should be particularly reliable. The memory cells of the cell-array blocks 31-2 and 31-3, both having the same storage capacity as the block 31-1, are selected simultaneously with the cells of the block 31-1, also in accordance with the same row and column addresses. Thus, the same data is written into, or read from, the corresponding memory cells of the cell-array blocks 31-1, 31-2, and 31-3. The data stored in the memory cells of the cell-array blocks 31-1, 31-2 and 31-3 is erased when an erase-gate signal EL1 is supplied to the erasing gates of the corresponding memory cells of these blocks 31-1, 31-2, and 31-3.

The operation of the EEPROM shown in FIG. 2 will now be explained.

Assuming that the first row-address signal is supplied to the row address buffer 40 in order to select the cell-array block 31-1, the multi-cell selecting circuit 42 sets the multi-cell selecting signals MS and $\overline{MS}$ at the "1" level and the "0" level, respectively. In this case, the comparator 43 is set in the multi-cell selection mode, and carries out majority logic operation on the data items SA1, SA2, and SA3 which have been output from the cell-array blocks 31-1, 31-2, and 31-3, respectively. More specifically, if two or all of these data items SA1, SA2, and SA3 are identical, the comparator 43 outputs one of these identical data items to the data-output circuit 38 and hence to the external device.

On the other hand, when the second row-address signal is supplied to the row address buffer 40 in order to select the cell-array block 31-4, the multi-cell selecting circuit 42 sets the multi-cell selecting signals MS and $\overline{MS}$ at the "0" level and the "1" level, respectively. In this case, the comparator 43 is set in the non-multi-cell selection mode, and performs no majority logic operation at all. As a result, the comparator 43 outputs the data item SAI read from the cell-array block 31-4 to the data-output circuit 38. The data items SAI is then supplied from the data-output circuit 38 to the external device.

As has been pointed out, when the comparator 43 is set in the non-multi-cell selection mode, the column decoder 33-2 and the data-input circuit 36-2 which are associated with the cell-array block 31-2, and the column decoder 33-3 and the data-input circuit 36-3 which are associated with the cell-array block 31-3, are disabled. The purpose of this is to reduce, as much as possible, the number of times data is written into the memory cells of these cell-array blocks 31-2 and 31-3. Needless to say, the data item SAI can be correctly read out without disabling the column decoders 33-2 and 33-3 and the data-input circuits 36-2 and 36-3, provided that the comparator 43 is set in the non-multi-cell selection mode.

As has been described, when the cell-array block 31-1 is selected, majority logic operation is conducted on the three data items, i.e., SA1, SA2, and SA3, read from the cell-array blocks 31-1, 31-2, and 31-3, thereby determining which one of these data items is to be read out from the EEPROM. Therefore, the correct data can be read from the EEPROM even if one of the cell-array blocks 31-1, 31-2, 31-3 has defective memory cells. Assuming that the probability for each cell-array block to have one defective memory cell is 100 ppm, then the probability for two cell-array blocks to have a defective memory cell of the same address each is as low as 0.01 ppm, or 0.000001%. Practically no erroneous data is read from the cell-array block 31-1 to the external device. The EEPROM is, therefore, very reliable. Hence, if the cell-array block 31-1 is used as a fail-allocation table area FAT (FIG. 1) in which data must be reliably stored, the EEPROM can be used in a computer, in place of a floppy disk.

Figure 3:
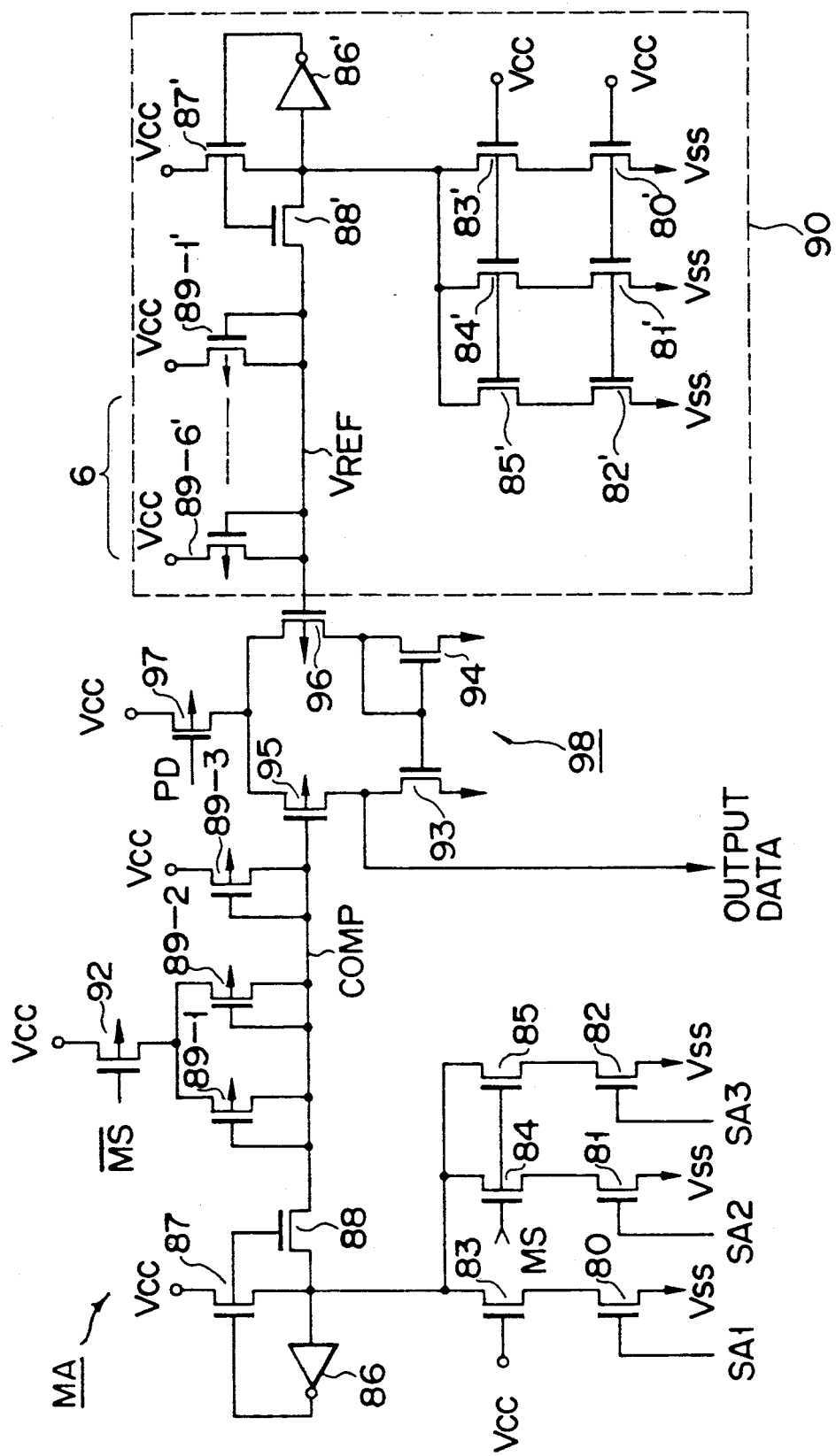
FIG. 3 is a diagram showing the comparator circuit incorporated in the EEPROM shown in FIG. 2.

The comparator 43 will now be described in detail, with reference to FIG. 3. As is illustrated in this figure, the comparator 43 has a power-supply potential terminal Vcc and a ground-potential terminal Vss. The comparator 43 further comprises main circuit MA, a reference voltage generator 90, and a current-mirror type sense amplifier 98. As can be understood from FIG. 3, the comparator 43 has MOS transistors, all being of enhancement type (E-type).

The main circuit MA of the comparator 43 comprises N-channel MOS transistors 80 to 85, N-channel MOS transistors 87 and 88, P-channel MOS transistors 89-1 to 89-3, a P-channel MOS transistor 92, and an inverter 86. The gates of the N-channel MOS transistors 80, 81, and 82 are connected to receive the data items SA1, SA2, and SA3 output from the cell-array blocks 31-1, 31-2, and 31-3. The sources of these transistors 80, 81, and 82 are connected to the ground-potential terminal Vss. The drains of the N-channel MOS transistors 80, 81 and 82 are connected to the sources of the N-channel MOS transistors 83, 84, and 85, respectively. The gate of the transistor 83 is coupled to the power-supply potential terminal Vcc, whereas the gates of the transistors 84 and 85 are connected to receive multi-cell selecting signal MS supplied from the multi-cell selecting circuit 42. The drains of the transistors 83, 84, and 85 are connected to each other. The current path of the N-channel MOS transistor 87 is connected between the node of the drains of the transistors 83, 84 and 85 and the power-supply potential terminal Vcc. The source of the transistor 87 is coupled to the source of the N-channel MOS transistor 88, and is connected to the input of an inverter 86. The output of this inverter 86 is connected to the gates of the transistors 87 and 88. The inverter 86 and the N-channel MOS transistors 87 and 88 constitute a bias circuit. The P-channel MOS transistors 89-1, 89-2, and 89-3 are connected to each other, at gate and drain. The node of their drains is connected to the drain of the transistor 88. The source of the transistor 89-3 is coupled to the power-supply potential terminal Vcc, the sources of the transistors 89-1 and 89-2 are connected to each other. The current path of the P-channel MOS transistor 92 is connected between the node of the sources of the transistors 89-1 and 89-2 and the power-supply potential terminal Vcc. The multi-cell selecting signal $\overline{MS}$ is input to the gate of the transistor 92.

The reference voltage generator 90 is similar in structure to the main circuit MA. As is shown in FIG. 3, it comprises N-channel MOS transistors 80' to 85', N-channel MOS transistor 87' and 88', P-channel MOS transistors 89-1' to 89-6', and an inverter 86'. The dimensions of the transistors incorporated in the reference voltage generator 90 are identical to those of the transistors used in the main circuit MA. The reference voltage generator 90 is different from the main circuit in three respects. First, the gates of the N-channel MOS transistors 80' to 85' are connected to the power-supply potential terminal Vcc. Second, no transistors are used which correspond to the P-channel transistors 92 used as a load transistor in the main circuit MA. Third, six P-channel transistors 89-1' to 89-6' are used as load transistors.

The current-mirror type sense amplifier 98 comprises N-channel MOS transistors 93 and 94, a pair of P-channel MOS transistors 95 and 96, and a P-channel MOS transistor 97. The gate of the transistor 95 is connected to receive a comparison signal COMP from the main circuit MA. The gate of the transistor 96 is connected to receive the reference voltage VREF generated by the reference voltage generator 90. The gate of the transistor 97 is connected to receive an enable signal PD.

Figure 4:
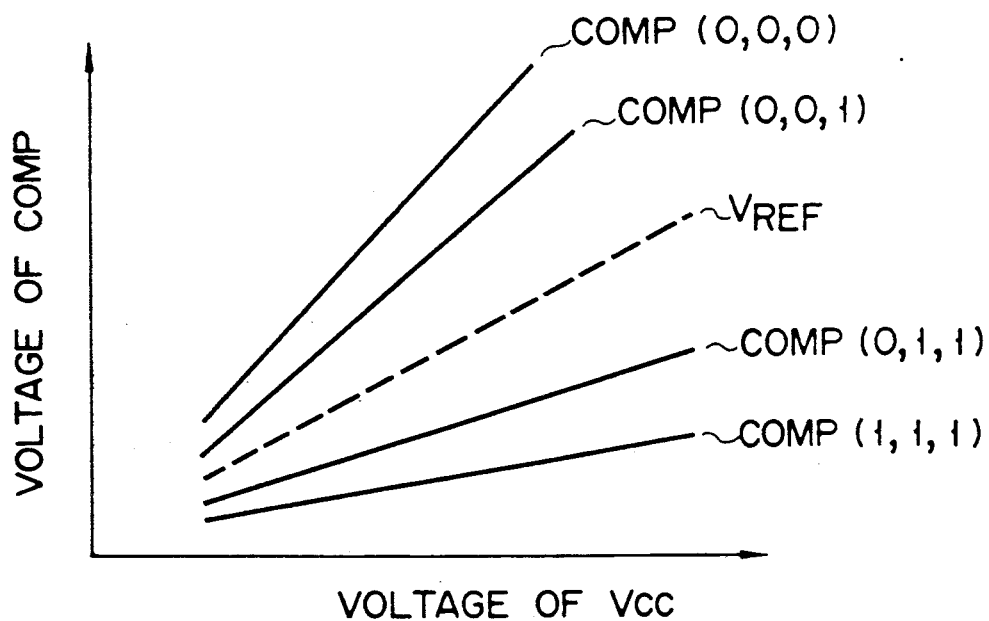
FIG. 4 is a graph representing the operating characteristic of the comparator circuit illustrated in FIG. 3.

The basic operation of the comparator 43 will now be explained. The comparator 43 is set in multi-cell selection mode, the multi-cell selecting signals MS and $\overline{MS}$ are at the "1" level and the "0" level, respectively. Hence, the transistors 83 to 85 and the transistor 92 are on. If the data items AS1, AS2, and AS3 are all "1" at this time, the voltage of the comparison signal COMP is determined by the ratio of the sum of the three pull-up currents flowing through the load transistors 89-1, 89-2 and 89-3, to the sum of the three pull-down currents flowing through the transistors 80 to 85. This voltage of the comparison signal, COMP (1, 1, 1) changes in proportion to the voltage of the power-supply potential terminal Vcc, as is illustrated in FIG. 4. In FIG. 4, COMP (0, 1, 1) is the voltage which the comparison signal COMP has when two of the data items SA1 to SA3 are "1", COMP (0, 0, 1) is the voltage which the comparison signal COMP has when one of the data items SA1 to SA3 are "1", and COMP (0, 0, 0) is the voltage which the comparison signal COMP has when none of the data items SA1 to SA3 is a "1".

As is evident from FIG. 4, the voltage COMP (0, 0, 0) is highest of all voltage shown. The voltage COMP (0, 0, 1) is the second highest, and the voltage COMP (0, 1, 1) is the third highest. The voltage COMP (1, 1, 1) is the lowest. The reference voltage VREF generated by the reference voltage generator 90 is constant, determined by the ratio of the sum of the six pull-up currents flowing through the transistors 89-1' to 89-6' used as load transistors, to the sum of the three pull-down currents flowing through the transistors 80' to 85'. Therefore, the reference voltage VREF is somewhere between the voltage COMP (0, 0, 1) and the voltage COMP (0, 1, 1). Hence, when two or all of the data items SA1, SA2, and SA3 are "0", the voltage of the signal COMP will rise above the reference voltage VREF. In this case, the current-mirror type sense amplifier 98, which amplifies the difference between the voltage of the comparison signal COMP and the reference voltage VREF, outputs a signal at the "0" level as an output data. On the other hand, when two or all of the data items SA1, SA2, and SA3 are "1", the voltage of the signal COMP will fall below the voltage VREF. If this is the case, the current-mirror type sense amplifier 98 outputs a signal at the "1" level as an output data. In this way, the data to be output to the external device is determined based on the results of the majority logic operation conducted on the data items SA1, SA2, and SA3, when the comparator 43 is set in the multi-cell selection mode.

When the comparator 43 is set in the non-multi-cell selection mode, the multi-cell selecting signals MS and $\overline{MS}$ are at the "0" level and the "1" level, respectively. The transistors 84, 85, and 92 are off. If the data item SA1 is a "1" at this time, the main circuit MA outputs a comparison signal COMP having the voltage determined by the ratio of the one pull-up current flowing through the load transistor 89-3 to the one pull-down current flowing through the transistors 80 and 83. The voltage of the comparison signal COMP is equal to the voltage COMP (1, 1, 1) since the pull-up current and the pull-down current are equal. If the data item SA1 is a "0", the voltage of the comparison signal COMP is equal to the voltage COMP (0, 0, 0). In this way, the data to be output to the external device is determined by the data item SA1, when the comparator 43 is set in the multi-cell selection mode.

Figure 5:
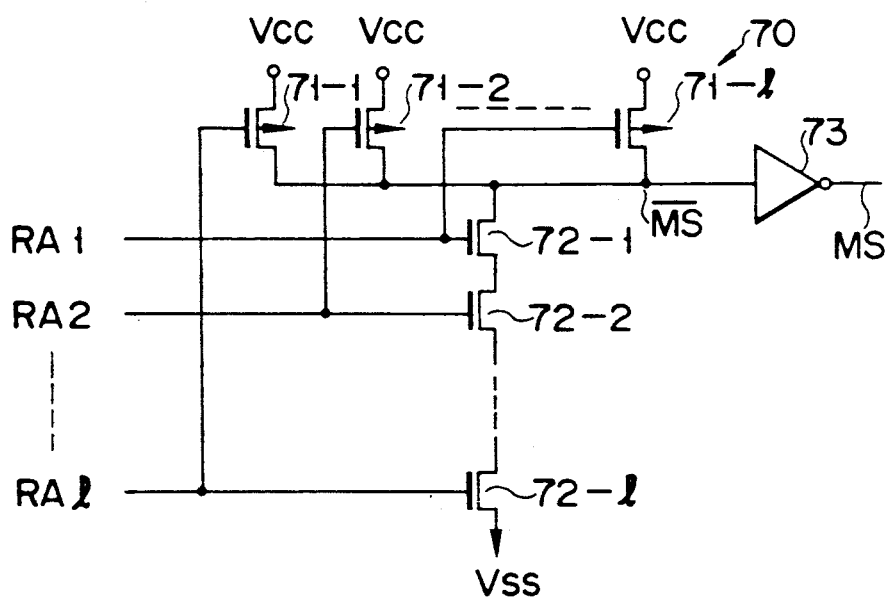
FIG. 5 is a diagram showing the multi-cell selecting circuit used in the EEPROM shown in FIG. 2.

The multi-cell selecting circuit 42 (FIG. 2) will now be described in detail, with respect to FIG. 5. The circuit 42 has a power-supply potential terminal Vcc and a ground potential terminal Vss. All MOS transistors incorporated in this circuit 42 are of enhancement type. As is shown in FIG. 5, the multi-cell selecting circuit 42 comprises an l-input NAND gate 70 and an inverter 73. The NAND gate 70 is comprised of P-channel transistors 71-1 to 71-l and N-channel transistors 72-1 to 72-l, and is connected to receive the more significant l bits RA1 to RAl of the first row address signal supplied from the row address buffer 40 (FIG. 2). The inverter 73 inverts the output signal of the NAND gate 70. Its output signal is used as multi-cell selecting signal MS. Since the more significant l bits RA1 to RAl of the first row address signal are all "1", the signals MS and $\overline{MS}$ are at the "1" level and the "0" level only when the first row address signal is supplied from the row address buffer 40 to the multi-cell selecting circuit 42.

FIG. 6 illustrates an EEPROM according to the second embodiment of the present invention. This EEPROM is different from the EEPROM (FIG. 2) according to the first embodiment only in that two cell-array blocks 31-5 and 31-6, which have the same storage capacity as a cell-array block 31-1, are different in structure from the block 31-1. The EEPROM according to the first embodiment has a relatively large chip size since the cell-array blocks 31-2 and 31-3 are of the same structure, i.e., k (rows)×n (columns), as the cell-array block 31-1, and each require one row decoder. In the EEPROM of the second embodiment, the blocks 31-5 and 31-6, which corresponds to blocks 31-2 and 31-3 of the first embodiment, are each a 2k (rows)×n/2 (columns) matrix of memory cells, and are arranged in the same direction as that in which word lines extend, so that the word lines are used for both cell-array blocks 31-5 and 31-6. Hence, the rows of memory cells of the both blocks 31-5 and 31-6 are selected by a single row decoder 32-5. This EEPROM has two column-selecting gates 39-4 and 39-5 which are provided for with the cell-array blocks 31-5 and 31-6 and which are selected by a single column decoder 33-4. The EEPROM also comprises two data-input circuits 36-2 and 36-3 and two sense amplifiers 37-2 and 37-3. The circuit 36-2 and the amplifier 37-2 are provided for the cell-array block 31-5, and the circuit 36-3 and the amplifier 37-3 are provided for the cell-array block 31-6.

With the EEPROM illustrated in FIG. 6, it is possible to write data into, and read data from, two cell-array blocks 31-5 and 31-6 at the same time, by means of one row decoder 32-5 and one column decoder 33-4. Obviously, the EEPROM is more simple in structure than the EEPROM of the first embodiment which has one row decoder and one column decoder for addressing any desired memory cell of each cell-array block. Further, the EEPROM is easier to design than the EEPROM of the first embodiment since the total length of the blocks 31-5 and 31-6, as measured along the word lines, is equal to the length of the cell-array block 31-1.

The row decoder 32-5 is designed to select one of the 2K word lines, whereas the row decoder 32-1 is designed to select one of the k word lines. Further, the column decoder 33-4 is designed to select one of the n/2 bit lines, whereas the column decoder 33-1 is designed to select one of the n bit lines. Therefore, not only the bits of the first row address signal supplied externally via a row address buffer 40, but also some bits of the column address signal supplied externally via a column address buffer 41, e.g., the more significant bits thereof, are supplied to the row decoder 32-5 in order to supply the row decoder 32-5 with a row address signal consisting of a sufficient number of bits. Only the remaining bits of the column-address signal, e.g., the less significant bits thereof, are supplied as a column address signal to the column decoder 33-4. Some of the column-address signal are input to a multi-cell selecting circuit 42-1, as is to the row decoder 32-5, so that a comparator 43 is set into the multi-cell selection mode, whichever word line the row decoder 32-5 has selected.

Figure 7:
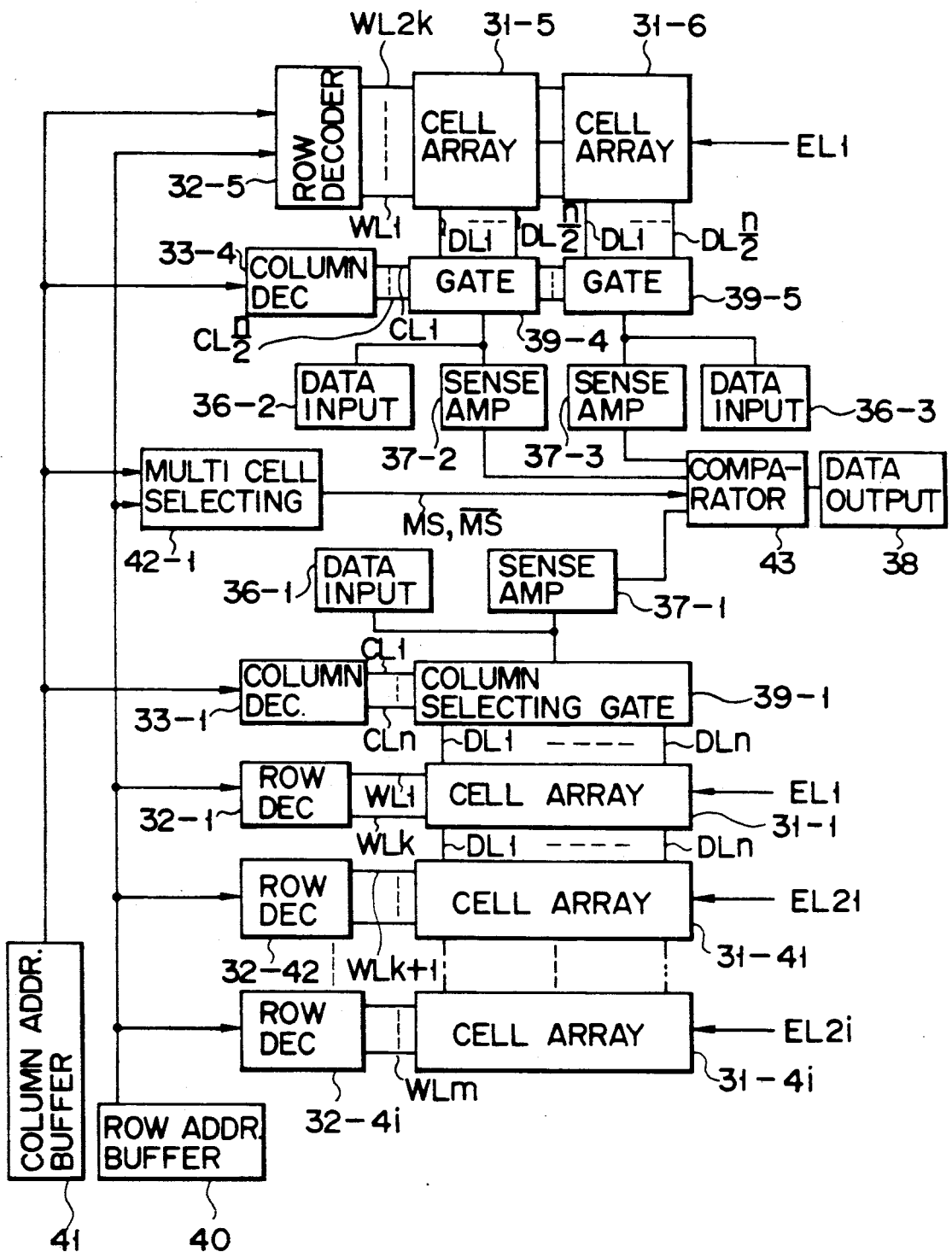
FIG. 7 is a block diagram showing an EEPROM which is a third embodiment of this invention.

FIG. 7 illustrates an EEPROM according to the third embodiment of the present invention. This EEPROM is different from the EEPROM (FIG. 6) according to the second embodiment in two respects. First, a cell-array block 31-4 is divided into i sub-blocks 31-41 to 31-4i. Secondly, a row decoder 32-4 is divided into i sub-decoders 32-41 to 32-4i. As is evident from FIG. 7, the cell-array sub-blocks 31-41 to 31-4i are arranged in the same direction as that in which bit lines DLl to DLn extend, so that these bit lines are used commonly for these sub-blocks 31-41 to 31-4i. One erasing gate (not shown) is connected to each of the cell-array sub-blocks 31-41 to 31-4i. Erase-gate signals EL2l to EL2i are selectively supplied through these erasing gates to the sub-blocks 31-41 to 31-4i from an erase-voltage selecting circuit (not shown) which is a decoder.

To use the EEPROM shown in FIG. 7 in a computer, in place of, for example, a 1-megabit floppy disk, it is necessary only to re-design the EEPROM into one having a storage capacity of 128K words × 8 bits. More precisely, the design parameters k, m, n, and i of the EEPROM should be set at 32, 1024, 128, and 248, respectively. In this case, the cell-array block 31-1 used as fail-allocation table area FAT can store 4096 bytes of data ($= k \times m = 32 \times 128$ bytes). Since four word lines ($=(m-k)/i = 992/248$) are allocated to each of the cell-array sub-blocks 31-41 to 31-4i, these sub-blocks can store 512 bytes of data ($4 \times n = 4$ 128 bytes).

The storage capacity of the cell-array block 31-1 (4096 bytes) is great enough for a fail-allocation table area FAT of a floppy disk. Needless to say, the storage capacities assigned to the cell-array block 31-1 and the cell-array sub-blocks 31-41 to 31-4i can be altered in accordance with the use of this EEPROM is used.

The architecture which makes it possible to erase the data stored in each cell-array block, independently of data in any other cell-array block, can be applied to the EEPROM of the first embodiment illustrated in FIG. 2.

FIG. 8 illustrates an EEPROM according to the fourth embodiment of the present invention. This EEPROM is different from the EEPROM (FIG. 6) of the second embodiment in two respects. First, a cell-array block 31-4 is divided into i sub-blocks 31-41 to 31-4i which are arranged in the same direction as that in which word lines WLl to WLm extend, so that these word lines are used commonly for these sub-blocks 31-41 to 31-4i. Secondly, a cell-array block 31-1, which is used as a fail-allocation table area FAT, and two cell-array blocks 31-7 and 31-8, which have the same storage capacity of the block 31-1, and the sub-blocks 31-41 to 31-4i are arranged side by side, in a line parallel to the rows of memory cells of any of these blocks. Hence, different column addresses are assigned to the cell-array blocks 31-1 and the cell-array sub-blocks 31-41 to 31-4i, and the column address assigned to the cell-array block 31-1 is assigned also to the cell-array blocks 31-7 and 31-8. One erasing gate (not shown) is connected to each of the cell-array sub-blocks 31-41 to 31-4i. Erase-gate signals EL2l to EL2i are selectively supplied through these erasing gates to the sub-blocks 31-41 to 31-4i from an erase-voltage selecting circuit (not shown). A common erasing gate (not shown) is connected to the cell-array blocks 31-1, 31-7, and 31-8. An erase-gate signal EL1 is supplied to the erasing gate of these blocks 31-1, 31-7, and 31-8.

Like the EEPROM shown in FIG. 6, the EEPROM shown in FIG. 8 comprises a row decoder 32, a column decoder 33, sense amplifiers 37-1, 37-2 and 37-3, a column-selecting gates 39-1, 39-2, and 39-3, a row address buffer 40, a column address buffer 41, a multi-cell selecting circuit 42-2, and a comparator 43. The row decoder 32 decodes the row address signal supplied from an external device via the row address buffer 40 and selects one of word lines WLl to WLm in accordance with the row address signal thus decoded. The column decoder 33 decodes the column address signal supplied from the external device via the column address buffer 41 and selects one of column-selecting lines CLl to CLn. The column-selecting gate 39-1 supplies data from the cell-array block 31-1 to the sense amplifier 37-1 when the column decoder 33 selects one of the columnselecting lines CLl to CLk. When the column decoder 33 selects any one of column-selecting line CLl to CLk, the column-selecting gates 39-2 and 39-3 supply data from the cell-array blocks 31-7 and 31-8 to the sense amplifiers 37-2 and 37-3, respectively. The multi-cell selecting circuit 42-2 sets the comparator 43 in multi-cell selection mode when the column address buffer 41 supplies the column decoder 33 with such a column address signal as would cause the column decoder 33 to select one of the column-selecting lines CLl to CLk. The circuit 42-2 sets the comparator 43 in non-multi-cell selection mode when the column address buffer 41 supplies the column decoder 33 with any other address signal.

As can be understood from the above, all cell-array blocks 31-1, 31-7, 31-8, and 31-41 to 31-4i can be selectively accessed by means of only one row decoder and only one column decoder in the EEPROM illustrated in FIG. 8. The EEPROM is, therefore, simple in structure.

In the EEPROMs illustrated in FIGS. 7 and 8, one erasing gate is provided for each of the cell-array blocks. Alternatively, no erasing gates are used for the cell-array blocks used for storing data that must not be rewritten at all, so that the data stored in these blocks cannot be erased. Another alternative is to use an erase-prohibiting means or a programming means (e.g., a fuse) which makes it impossible to erase data stored in some of the cell-array blocks.

FIG. 9 illustrates an EEPROM according to the fifth embodiment of the present invention. This EEPROM is so designed that cell-array blocks 31-2 and 31-3 can be used not only as storage areas for storing data required in majority logic operation (hereinafter called "majority logic storage areas"), but also as extension storage areas. As may be understood from FIG. 9, this EEPROM is a combination of the EEPROM shown in FIG. 2 and an additional row address buffer 40-2, an extension memory exchanging circuit 50, and address switching circuits 51-1 and 51-2.

The additional address buffer 40-2 receives two row address signals specific to cell-array blocks 31-2 and 31-3, respectively, which have been supplied from an external device, and supplies these address signals to the address switching circuits 51-1 and 51-2. A row address buffer 40 supplies a row-address signal to the address switching circuits 51-1 and 51-2. The extension memory exchanging circuit 50 is designed to selectively set the operation mode of the EEPROM into majority logic mode, or extension memory mode. More specifically, the circuit 50 outputs a signal EXM at a "0" level in order to set the EEPROM into majority logic mode, thereby to use the cell-array block 31-2 and 31-3 as majority logic storage areas, and a signal EXM at a "1" level in order to set the EEPROM into extension memory mode, thereby to use the cell-array blocks 31-2 and 31-3 as extension storage areas. The output signal EXM of the extension memory exchanging circuit 50 is supplied to the address switching circuit 51-1 and 51-2 and a multi-cell selecting circuit 42'.

The address switching circuit 51-1 selects the row-address signal supplied from the row address buffer 40 in response to the signal EXM at the "0" level, and supplies this row-address signal to the row decoder 32-2, and selects the row-address signal supplied from the row address buffer 40-2 in response to the signal EXM at the "1" level, and supplies this row-address signal to the row decoder 32-2. Similarly, the address switching circuit 51-2 selects the row-address signal supplied from the row address buffer 40 in response to the signal EXM at the "0" level, and supplies this row-address signal to the row decoder 32-3, and selects the row-address signal output from the row address buffer 40-2 in response to the signal EXM at the "1" level, and supplies this row-address signal to the row decoder 32-3.

The multi-cell selecting circuit 42' generates and supplies control signals MS1, MS2, and MS3, each at the "1" level, to a comparator 43', thereby to set the comparator 43' into the multi-cell selection mode, when it receives both the signal EXM at the "0" level and the row-address signal supplied from the row-address buffer 40 for selecting the cell-array block 31-1. Also, the multi-Cell selecting circuit 42' generates and supplies only the control signal MS1 at the "1" level to a comparator 43', thereby to set the comparator 43' into the non-multi-cell selection mode and supply the data read from the cell-array block 31-4 to an external device, when it receives both the signal EXM at the "0" level and row-address signal supplied from the row-address buffer 40 for selecting the cell-array block 31-4.

Further, when the multi-cell selecting circuit 42' receives the signal EXM at the "1" level, it sets the comparator 43' into the non-multi-cell selection mode and those of the signals MS1, MS2, and MS3, which correspond to the selected cell-array block, at the "1" level, thereby to use the cell-array blocks 31-2 and 31-3 as extension storage areas. More specifically, the circuit 42' sets the signal MS1 at the "1" level when it receives both the signal EXM at the "1" level and a row-address signal for selecting the cell-array block 31-1 or 31-4. The circuit 42' sets the signal MS2 at the "1" level when it receives both the signal EXM at the "1" level and a row-address signal for selecting the cell-array block 31-2. The circuit 42' sets the signal MS3 at the "1" level when it receives both the signal EXM at the "1" level and a row-address signal for selecting the cell-array block 31-3.

The comparator 43' is set into the multi-cell selecting mode when all of the control signals MS1, MS2, and MS3 are at the "1" level. In this case, the comparator 43' carries out majority logic operation on the data items SA1, SA2, and SA3, thereby determining the data to be read out from the EEPROM. The comparator 43' is set into the non-multi-cell selecting mode when only one of the control signals MS1, MS2, and MS3 is at the "1" level, thereby supplying the data item corresponding to the control signal at the "1" level to the external device. For example, when only the control signal MS1 is at the "1" level, the data item SA1 is read from the EEPROM.

As has been described, the EEPROM according to the fifth embodiment of the invention is characterized in that the cell-array blocks 31-2 and 31-3 have either the same address as the cell-array block 31-1 or specific addresses, respectively, in accordance with whether these blocks 31-2 and 31-3 are used as majority logic storage areas or extension storage areas. In other words, the use of these cell-array blocks 31-2 and 31-3 can be switched, so that the cell-array blocks are used as either majority logic storage areas or extension storage areas.

FIG. 10 is a circuit diagram illustrating one of the address-switching circuits 51-1 and 51-2 which are identical and designed to process a 1-bit address signal. As is shown in this figure, the address-switching circuit comprises two transfer gates G1 and G2 and two inverters 105 and 106. The transfer gate G1 is formed of an N-channel MOS transistor 103 and a P-channel MOS transistor 104, and the transfer gate G2 is composed of an N-channel MOS transistor 101 and a P-channel MOS transistor 102.

The signal EXM output from the extension memory exchanging circuit 50 is supplied via the inverter 105 to the gate of the P-channel MOS transistor 104 and to the gate of the N-channel MOS transistor 101. The signal EXM is also supplied via the inverters 105 and 106 to the gate of the N-channel MOS transistor 103 and the rate of the P-channel MOS transistor 102. The 1-bit address signal RA40 output from the row address buffer 40 is input to the transfer gate G2, while the 1-bit address signal RA40-2 is input to the transfer gate G1. When the signal EXM is at the "0" level, the transfer gates G2 and G1 are on and off, respectively. Therefore, the 1-bit address signal RA40 is supplied as an input address signal RAi to the row decoder 32-2 or 32-3. On the other hand, when the signal EXM is at the "1"- level, the transfer gates G2 and G1 are off and on, respectively. In this case, the 1-bit address signal RA40-2 is supplied as an input address signal RAi to the row decoder 32-2 or 32-3.

FIG. 11A is a circuit diagram showing the extension memory exchanging circuit 50 which is controlled by an externally supplied control signal. As FIG. 11A shows, the circuit 50 comprises a pad Pl and two inverters Il and 12. The pad Pl is connected to receive the control signal, which is inverted by the inverter Il and is further inverted by the inverter 12. Hence, when the control signal is at the "1" level, the inverter I2 outputs a signal EXM at the "1" level. Conversely, when the control signal is at the "0" level, the inverter I2 outputs a signal EXM at the "0" level.

FIG. 11B is a circuit diagram showing a modified extension memory exchanging circuit 50 of the type having a fuse element. As FIG. 11B shows, the circuit 50 comprises a fuse element 201, a P-channel MOS transistor 202, a capacitor 203, and an inverter I3. As long as the fuse element 201 is intact, the output signal EXM of the circuit 50 remains at the "1" level. When the fuse element 201 is cut, the output signal EXM is set at the "0" level. The capacitor 203 initially sets the potential of the input node of the inverter I3 at the "1" level when the power-supply voltage Vcc is applied to it after the fuse element has been cut. The fuse element 201 can be either a polysilicon layer or a nonvolatile cell transistor.

The multi-cell selecting circuit 42' incorporated in the EEPROM shown in FIG. 9 will now be described in detail, with reference to FIG. 12. The circuit 42' comprises eight NAND gates 301 to 308 and two inverters 309 and 310. The NAND gates 301 and 306 are used to generate a control signal MS1. The NAND gate 301 receives the more significant l bits RAl to RAl of the row-address signal supplied via the row address buffer 40 from the external device. The output signal of this NAND gate 301 is supplied to the first input of the NAND gate 306. The signal EXM output by the extension memory exchanging circuit 50 (FIG. 9) is supplied to the second input of the NAND gate 306. When the signal EXM is at the "0" level, thereby to use the cell-array blocks 31-2 and 31-3 as majority logic storage areas, the NAND gate 306 outputs a control signal MS1 at the "1" level, regardless of the output signal of the NAND gate 301. When the signal EXM is at the "1" level, thereby to use the cell-array blocks 31-2 and 31-3 as extension storage areas, the NAND gate 306 outputs a control signal MS1 at the "1" level if all l bits RA1 to RAl of the row-address signal are at the "1" level to select the cell-array block 31-1.

The NAND gates 302, 303, and 307 and the inverter 309 are used to generate a control signal MS2. The NAND gate 302 receives the more significant l bits RAl to RAl of the row-address signal supplied via the row address buffer 40 from the external device. It also receives a signal $\overline{EXM}$ supplied through the inverter 309. The address signals RBl to RBk supplied from an external device through the additional row address buffer 40-2, for selecting the cell-array block 31-2, are supplied to the NAND gate 303, and the signal EXM is also supplied to the NAND gate 303. The output signals of the NAND gates 302 and 303 are supplied to the NAND gate 307. When the signal EXM is at the "0" level, the NAND gate 302 outputs a signal at the "0" level only if the bits RAl to RAl of the row-address signal are all at the "1" level to select the cell-array block 31-1. As a result, the NAND gate 307 outputs a control signal MS2 at the "1" level. When the EXM is at the "1" level, the NAND gate 303 outputs a signal at the "0" level only if the address signals RBl to RBk for selecting the cell-array block 31-2 are supplied to the NAND gate 302 through the additional row address buffer 40-2. In this case, too, the NAND gate 307 outputs a control signal MS2 at the "1" level.

The NAND gates 304, 305, and 308 and inverter 310 are used to generate a control signal MS3. The NAND gate 304 receives the more significant l bits RA1 to RAl of the row-address signal, and also the signal $\overline{EXM}$ from the inverter 301. The NAND gate 305 receives the address signals RBl' to RBk' supplied from an external device through the additional row address buffer 40-2, for selecting the cell-array block 31-3, and also the signal EXM. The outputs of the NAND gates 304 and 305 are supplied to the inputs of the NAND gate 308. When the signal EXM is at the "0" level, the NAND gate 304 outputs a signal at the "0" level only if the bits RAl to RAl are all at the "1" level to select the cell-array block 31-1. In this case, the NAND gate 308 outputs a control signal MS3 at the "1" level. On the other hand, when the signal EXM is at the "1" level, the NAND gate 305 outputs a signal at the "0" level only if the address signals RBl' to RBk' for selecting the cell-array block 31-3 are supplied via the additional row address buffer 40-2 to the NAND gate 305. In this case, too, the NAND gate 308 outputs a control signal MS3 at the "1" level.

Figure 13:
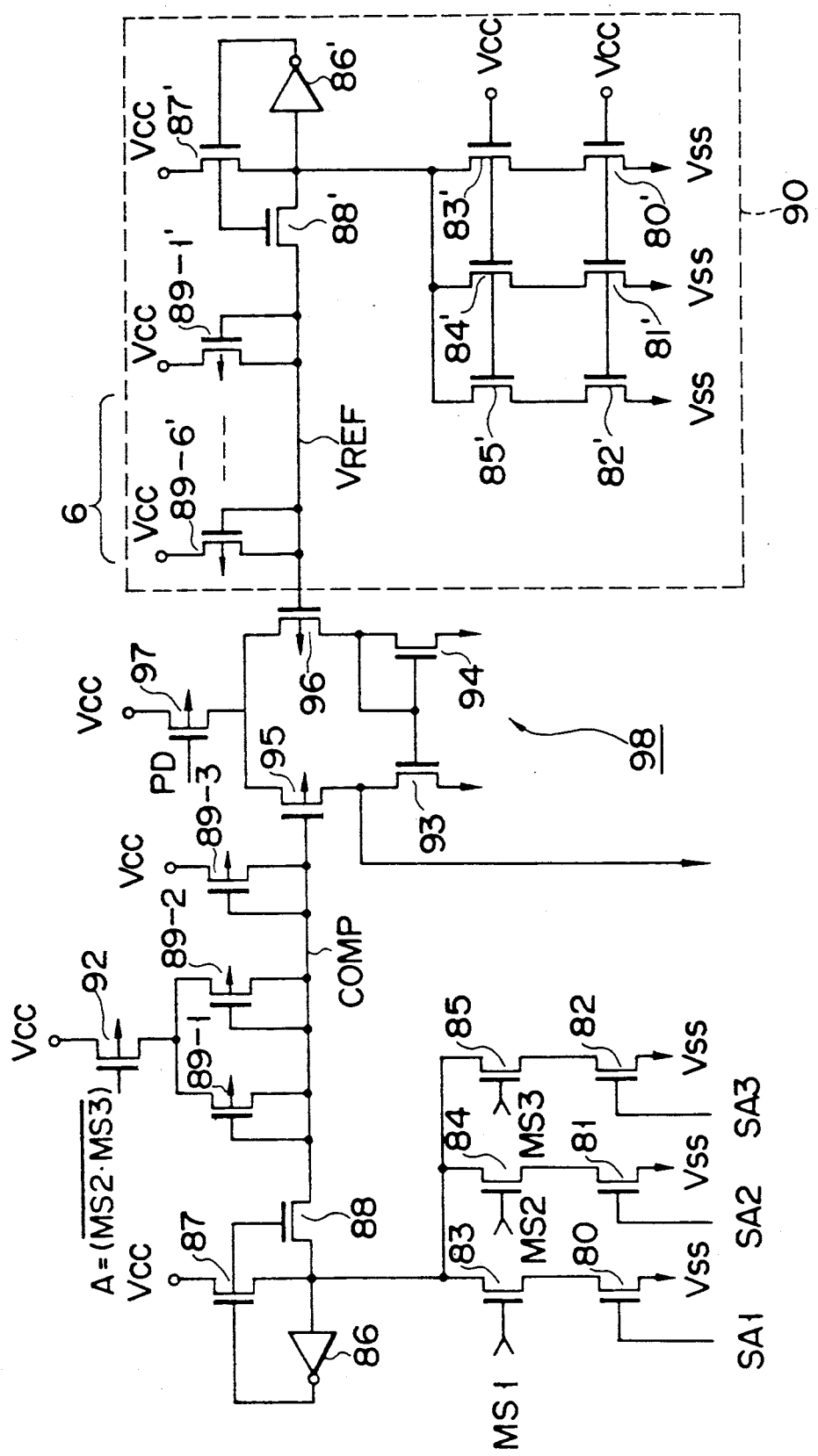
FIG. 13 is a diagram showing the comparator circuit incorporated in the EEPROM illustrated in FIG. 9.

FIG. 13 illustrates, in detail, the comparator 43' used in the EEPROM shown in FIG. 9. This comparator 43' is different from the comparator 43 (FIG. 3) in two respects. First, control signals MS1, MS2, and MS3 are input to the gates of the transistors 83, 84, and 85. Second, a signal A ($= \overline{MS2.MS3}$), obtained by inverting the logical product of control signals MS2 and MS3, is input to the gate of the transistor 92. The transistors 83 to 85 are turned on when the control signals MS1, MS2, and MS3 are all at the "1" level. If this is the case, the comparator 43' carries out majority logic operation on the data items SA1, SA2, and SA3. When only one of the control signals MS1, MS2, and MS3 is at the "1" level, the transistor to which this control signal at the "1" level is turned on. In this case, the comparator 43' outputs the data corresponding to the control signal at the "1" level.

The operations of the multi-cell selecting circuit 42' comparator 43' will now be explained, with reference to the timing chart shown in FIG. 14. When the signal EXM is at the "0" level, the EEPROM is set into the majority logic mode. When the row-address signal for selecting the cell-array block 31-1 is supplied from the external device under this condition, all control signals MS1, MS2, and MS3 output by the multi-cell selecting circuit 42' are at the "1" level, and signal A is at the "0" level, whereby the comparator 43' is set into the multi-cell selection mode. As a result, the transistors 83 to 85 (FIG. 12) are turned on, and the majority logic operation is performed on the data items SA1, SA2, and SA3 read from the cell-array blocks 31-1, 31-2, and 31-3, thereby determining the data to be read from the EEPROM. On the other hand, when the row-address signal for selecting the cell-array block 31-4 is supplied from the external device, only the control signal MS1 output by the multi-cell selecting circuit 42' is at the "1" level, and the signal A is at the "1" level. In this case, the data SA1 read from the cell-array block 31-4 is output to the external device.

Further, when the signal EXM is at the "1" level, the EEPROM is set into the extension memory mode. Under this condition, when the row-address signal for selecting the cell-array block 31-1 or 31-4 is supplied to the EEPROM, the control signal MS1 is set at the "1" level. When the row-address signal for selecting the cell-array block 31-2 is supplied to the EEPROM, the control signal MS2 is set at the "1" level. When the row-address signal for selecting the cell array block 31-3 is supplied to the EEPROM, the control signal MS3 is set at the "1" level. While the EEPROM is set in the extension memory mode, any control signal is set at the "1" level in this way, and the data read from the cell-array block corresponding to the control signal is supplied from the EEPROM.

Figure 15A:
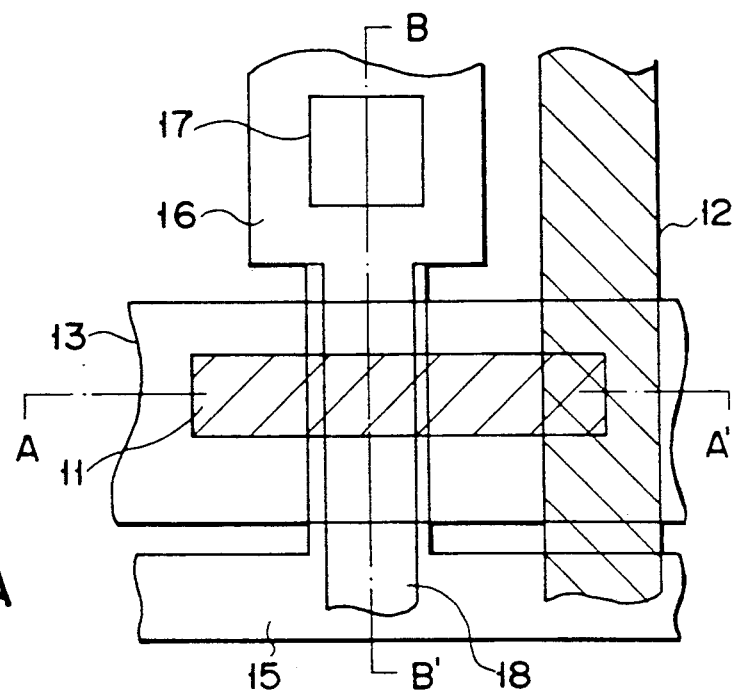
FIG. 15A is a plan view showing one of the identical memory cells incorporated in any EEPROM according to the present invention.
Figure 15B:
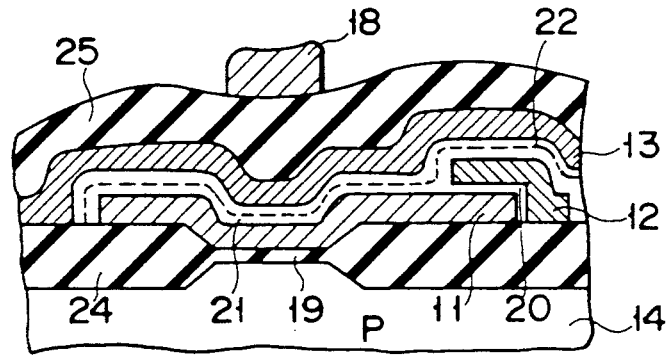
FIG. 15B is a cross-sectional view of the memory cell, taken along line B-B' in FIG. 15A.
Figure 15C:
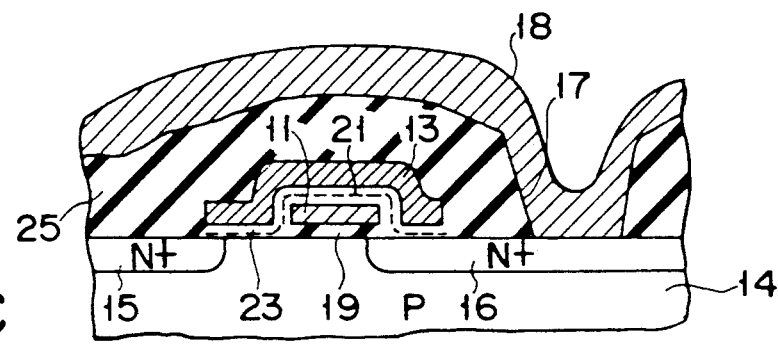
FIG. 15C is a cross-sectional view of the memory cell, taken along line C-C' in FIG. 15A.

FIGS. 15A, 15B, and 15C illustrate the structure of a memory cell which can be used in the EEPROMs according to the first to fifth embodiments of the present invention. FIG. 15A is a plan view of the memory cell; FIG. 15B is a cross-sectional view, taken along line A-A' in FIG. 15A; and FIG. 15C is also a cross-sectional view, taken along line B-B' in FIG. 15A. As is evident from FIGS. 15A, 15B, and 15C, the memory cell comprises a floating gate 11 made of a first polysilicon layer, an erasing gate 12 made of a second polysilicon layer, and a control gate 13 made of a third polysilicon layer. The control gate 13 is used also as a word line. The gates 11 and 12 are formed on a field oxide film 24 which is formed on a P-type substrate 14. A source region 15 and a drain region 16, both made of N+-type diffusion layers, are formed in the surface of the substrate 14. An inter-layer insulation film 25 is formed on the control gate 13. This film 25 has a contact hole 17. A bit line 18 made of aluminum is formed on the interlayer insulation film 25 and also in the contact hole 17, and is electrically connected to the drain region 16. A gate-insulation film 19 is formed between the floating gate 11 and the substrate 14. A gate-insulation film 20 is formed between the floating gate 11 and the erasing gate 12. Another gate-insulation film 21 is formed between the floating gate 11 and the control gate 13. This film 21 has an O-N-O (Oxide-Nitride-Oxide) structure consisting of three layers. Further, a gate-insulation film 22 is formed between the erasing gate 12 and the control gate 13. This film 22 has also an O-N-O structure.

Figures 16, 17:
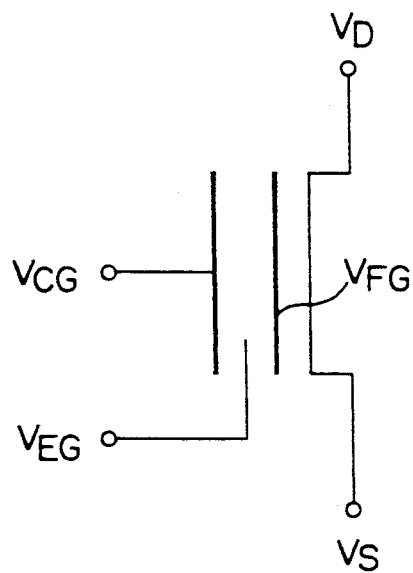
FIG. 16 is a table explaining the operation of the memory cell illustrated in FIGS. 15A, 15B and 15C.
FIG. 17 is an equivalent circuit diagram of the memory cell shown in FIGS. 15A, 15B, and 15C.

The operation of the memory cell described above will be explained, with reference to FIGS. 16 and 17. FIG. 16 is a table of data for explaining the basic operation of the memory cell, and FIG. 17 is an equivalent circuit diagram of the memory cell. To erase the data stored in the memory cell, the source potential $V_S$, drain potential $V_D$, and control-gate potential $V_{CG}$ of the cell are set at, 0 V, and erasing-gate potential $V_{EG}$ is set at, for example, $+27V$. Then, due to the Fowler-Nordheim tunnel effect, electrons are emitted from the floating gate into the erasing gate. As a result, the floating gate is positively charged, thus decreasing the threshold voltage of the memory cell, and the memory cell stores a data "1".

To write a data "0" into this memory cell, now storing the data "1", the control-gate potential $V_{CG}$, the drain potential $V_D$, the source potential $V_S$, and the erasing-gate potential $V_{EG}$ are set at $+21$ V, $+10$ V, 0 V, and $+5$ V, respectively. Hot-electron effect is thereby caused near the drain region, and the electrons generated by means of impact ionization are injected into the floating gate. The floating gate is negatively charged, increasing the threshold voltage of the memory cell, and the memory cell stores a data "0".

To write a data "1" into this memory cell, now storing the data "1", the drain potential $V_D$ is set at 0 V, instead of $+10$ V. In this case, no hot-electron effect occurs, and no electrons are injected into the floating gate. Hence, the data "1" is kept stored in the memory cell.

Therefore, either a data "0" or a "1" can be written into the memory cell by controlling the voltage applied to the drain region of the memory cell.

FIG. 18 is a cross-sectional view showing another type of memory cell which can be incorporated in the EEPROMs described above, and FIG. 19 is an equivalent circuit diagram of this memory cell. As is illustrated in FIG. 18, the cell comprises a P-type substrate 51, N-type diffusion regions 52, 53, and 54 formed in the surface of the substrate 51. An insulation film 55 is formed on that portion of the substrate 51, and on the parts of the N-type diffusion regions 52 and 53. A floating gate 56 made of a first polysilicon layer is formed on the insulation film 55. The film 55 has a thin portion 55A formed on the N-type diffusion region 53. That portion of the floating gate 56 formed on this thin portion 55A overlaps the N-type diffusion region 53. An insulation film 57 is formed on the floating gate 56, and a control gate 58 made of a second polysilicon layer is formed this film 57. An insulation film 59 is formed on that portion of the substrate 51, and a gate electrode 60 is formed on this insulation film 59. For example, the gate electrode 60 is made of the first polysilicon layer.

As can be understood from the equivalent circuit diagram shown in FIG. 19, the memory cell illustrated in FIG. 18 is a series circuit of a floating-gate type transistor 61 and an enhancement-type transistor 62. The floating-gate type transistor 61 has a source S (i.e., the diffusion region 52), a drain D (i.e., the diffusion region 53), a floating gate FG (i.e., the gate 56), a control gate CG (i.e., the gate 58). The enhancement-type transistor 62 has a source S (i.e., the diffusion region 53), a drain D (i.e., the diffusion region 54) connected to a bit line DL, a qate G (i.e., the gate 60) connected to a word line WL.

FIG. 20 is a table of data explaining the operation modes of the memory cell illustrated in FIG. 19. As is shown in this figure, the memory cell can operate in four modes, the data-erasing mode, the "0"-writing mode, the "1"-writing mode, and the data-reading mode.

In the data-erasing mode, a high voltage H of, for example, $+20$ V is applied as word-line potential $V_{WL}$ and control-gate potential $V_{CG}$ to the word line WL and the control gate CG, respectively. The floating-gate potential $V_{FG}$ is set at a high potential H of, for example, about $+12$ V by virtue of the capacitive coupling between the floating gate FG and the control ate CG. Since the transistor 62 is on at this time, the drain D of the floating gate type transistor 61 is set at 0 V. Hence, electrons are injected from the drain D of the transistor 61 into the floating gate FG through the thin portion 55A of the insulation film 55 (FIG. 18), due to the Fowler-Nordheim tunnel effect. The data stored in the memory cell is thereby erased, and a data "1" is written into the cell.

In both data-writing modes, the word-line potential $V_{WL}$, the control-gate potential $V_{CG}$, and the source potential VS are set at high value H, 0 V, and high value H of, for example, $+5$ V, respectively. To write a data "0" into the memory cell, the data-line potential $V_{DL}$ is set at a high voltage, and the floating gate FG is set at a low potential L due to the capacitive coupling between the floating gate FG and the control gate CG. Electrons are emitted from the floating gate FG into the drain D of the transistor 61 through the thin portion 55A of the insulation film 55 (FIG. 18), due to the Fowler-Nordheim tunnel effect. A data "0" is thereby written into the memory cell. To write a data "1" into the memory cell, the data-line potential $V_{DL}$ is set at 0 V, thereby reducing the potential difference between the floating gate FG and the control gate CG to substantially zero. No electrons are moved between the floating gate FG and the drain D of the transistor 61. The data "1" is kept stored in the memory cell. This state of data-storing is regarded as the writing of a data "1".

In the data-reading mode, the word line WL is selected, and its potential $V_{WL}$ is set to the value H of, for example, +5 V, and the data-line potential $V_{DL}$ is set at about +1 V. If the control-gate potential $V_{CG}$ is 0 V, the floating gate transistor 61 will be turned on or off, in accordance with the kind of the charge accumulated in the floating gate FG, i.e., either electrons or holes. When the data stored in memory cell is "1", and the floating gate FG accumulates electrons and is thus negatively charged, the transistor 61 is turned off, and no cell current flows. By contrast, when data stored in the memory cell is "0", and the floating gate FG accumulates holes and is positively charged, then the transistor 61 is turned on, and a cell current flows.

To read the data thus written in the memory cell, a sense amplifier (not shown) is used to detect the absence or present of a cell current, thereby reading either a data "1" or a data "0" from the memory cell.

As may be understood from the above, no erasing gate is required to erase the data stored in the memory cell. When the memory cell is incorporated, in a great number, into the EEPROMs according to the present invention, data can be easily erased from each EEPROM, not only in the unit of a data block stored in each cell-array block, but also in the unit of bytes or bits.

All embodiments described above are EEPROMs. Nonetheless, the majority logic operation for determining the data to be read out, which characterizes the present invention, can also apply to RAMs and static RAMs. When the majority logic operation is performed in a dynamic RAM or a static RAM having high-resistance, load memory cells, data can be correctly and reliably read from the RAM, despite that the memory cells of such a RAM are likely to be damaged by an extremely small leakage current or by α rays, resulting in bit errors at the value of about 1000 to 100 Fit.

According to the per preferred embodiments of the present invention, each word line can be divided into several ones, and one row decoder can be provided for each divided word line, in order to allow the EEPROM to operate at higher speeds. The individual divided word lines, the lower resistance they have. The lower the resistance of each divided word line, the shorter the time required for the word line to reach a sufficient potential, and hence, the shorter the access time of the EEPROM.

As has been described, data can be correctly read from the EEPROM according to the present invention by virtue of the majority logic operation performed on the data items read from a plurality of cell-array blocks, even if bit errors occur in some of the cell-array blocks.

What is claimed is:

1. A semiconductor memory device comprising:
    a first array of memory cells having a first area of M memory cells and a second area, in which data can be written electrically;
    a first means for accessing a memory cell of the first array;
    a plurality of second arrays of memory cells in which data can be written electrically, each second array having M memory cells, each memory cell of each second array corresponding to a respective memory cell of the first area;
    means for determining when the first memory accessing means accesses a memory cell in the first area including means for determining when the first memory accessing means reads a memory cell from the first area;
    means for determining when the first memory accessing means reads a memory cell from the second area;
    second means, active when the first accessing means accesses a memory cell in the first area, for accessing a corresponding memory cell in each second array;
    means for reading data to an external device including
        first means, active when the first accessing means reads a memory cell in the first area, for reading data to an external device in accordance with a majority logic processing of a first read data from the first area and of a corresponding second read data from each second array; and
        second means, active when the first accessing means reads a memory cell in the second area, for reading data to an external device in accordance with read data from the second area.

2. The semiconductor memory device according to claim 1, wherein said first reading means determines that a logic 1 is to be read to the external device when logic 1's are a majority of said first data and said second data, and that a logic 0 is to be read when logic 0's are a majority of said first data and said second data.

3. The semiconductor memory device according to claim 1, wherein said first and second accessing means respectively write the same data into a memory cell of said first area and the corresponding memory cell of each of said second arrays, when said semiconductor memory device is set in a write-access mode.

4. The semiconductor memory device according to claim 1, wherein the memory cells of said first array are arranged in rows and columns and located at intersections of first word lines and first bit lines.

5. The semiconductor memory device according to claim 4, wherein said first accessing means comprises a first row-selecting means for selecting one of said first word lines in accordance with a row-address signal input externally, and a first column-selecting means for selecting one of said first bit lines in accordance with a column-address signal input externally.

6. The semiconductor memory device according to claim 5, wherein two second arrays are provided, one of which consists of memory cells arranged in rows and columns and located at intersections of second word lines and second bit lines, and the other of which consists of memory cells arranged in rows and columns and located at intersections of third word lines and third bit lines.

7. The semiconductor memory device according to claim 6, wherein said second accessing means comprises a second row-selecting means for selecting one of said second word lines in accordance with a row-address signal input externally, a second column-selecting means for selecting one of said second bit lines in accordance with a column-address signal input externally, a third row-selecting means for selecting one of said third word lines in accordance with a row-address signal input externally, and a third column-selecting means for selecting one of said third bit lines in accordance with a column-address signal input externally.

8. The semiconductor memory device according to claim 7, wherein the memory cells of said first area, and the memory cells of each of said second arrays are arranged in k rows and n columns.

9. The semiconductor memory device according to claim 5, wherein two second arrays are provided, which are arranged in a direction of second word lines and one of which consists of memory cells arranged in rows and columns and located at intersections of said second word lines and second bit lines, and the other of which consists of memory cells arranged in rows and columns and located at intersections of said second word lines and third bit lines.

10. The semiconductor memory device according to claim 9, wherein said second accessing means comprises a second row-selecting means for selecting one of said second word lines in accordance with a row-address signal input externally, and a second column-selecting means for selecting one of said second bit lines and also one of said third bit lines in accordance with a column-address signal input externally.

11. The semiconductor memory device according to claim 9, wherein the memory cells of the first area are arranged in k rows and n columns, and the memory cells of each of said second arrays are arranged in 2k rows and n/2 columns.

12. The semiconductor memory device according to claim 5, wherein two second arrays are provided, which are arranged in a direction of rows of said first word lines, and one of which consists of memory cells arranged in rows and columns and located at intersections of said first word lines and second bit lines, and the other of which consists of memory cells arranged in rows and columns and located at intersections of said first word lines and third bit lines.

13. The semiconductor memory device according to claim 12, wherein said second memory-accessing means comprises a second column-selecting means for selecting one of said second bit lines and also one of said third bit lines in accordance with said column-address signal.

14. The semiconductor memory device according to claim 1, wherein each memory cell of the first area of the first array includes
   a control gate;
   a floating gate; and
   an erasing gate, coupled to a first erasing signal, and each memory cell of the second area of the first array includes
   a control gate;
   a floating gate; and
   an erasing gate, coupled to a second erasing signal from outside.

15. The semiconductor memory device according to claim 14, wherein each memory cell of the second array includes
   a control gate;
   a floating gate; and
   an erasing gate, coupled to the first erasing signal.

16. The semiconductor memory device according to claim 14, wherein each memory cell of the second array includes
   a control gate;
   a floating gate; and
   an erasing gate, coupled to a first erasing signal.

17. A semiconductor memory device adaptable for receiving a first address signal and a second address signal comprising:
   means for selecting either a first mode or a second mode;
   a first array of memory cells having a first are of M memory cells and a second area, in which data can be written electrically;
   first means for accessing a memory cell of the first array in accordance with the first address signal.
   a plurality of second arrays of memory cells in which data can be written electrically, each second array having M memory cells, each memory cell of each second array corresponding to a respective memory cell of the first area;
   means for determining when the first memory accessing means accesses a memory cell in the first area including means for determining when the first memory accessing means reads a memory cell from the first area;
   means for determining when the first memory accessing means reads a memory cell from the second area;
   second means, active when the mode selecting means selects the first mode and the first accessing means accesses a memory cell in the first area, for accessing a corresponding memory cell in each second array in accordance with the first address signal;
   third mode, active when the mode selecting means selects the second mode, for accessing a memory cell in one of the second arrays in accordance with the second address signal;
   means for reading data to an external device including
      first means, active when the mode selecting means selects the first mode and the first accessing means reads a memory cell in the first area, for reading data to an external device in accordance with a majority logic processing of a first read data from the first area and of a corresponding second read data from each second array;
      second means, active when the mode selecting means selects the first mode and the first accessing means reads a memory cell in the second area, for reading data to an external device in accordance with read data from the second area; and
      third means, active when the mode selecting means selects the second mode, for reading data to an external device in accordance with read data from the first array or with read data from the second array.

18. The semiconductor memory device according to claim 17, wherein said read-data determining means determines, when set in said first mode, that logic 1 is to be read out to the external device when logic 1's are a majority of all data items read from the specified area of said first cell array and said second cell arrays, and the a logic 0 is to be read out to the external device when logic 0's are a majority of all data items read from the specified area of said first cell array and said second cell arrays.

* * * * *